United States Patent
Do et al.

(10) Patent No.: US 9,449,970 B2
(45) Date of Patent: Sep. 20, 2016

(54) SEMICONDUCTOR DEVICES AND METHODS OF FORMING THE SAME

(71) Applicant: Samsung Electronics Co., Ltd., Suwon-si (KR)

(72) Inventors: Jung-Ho Do, Yongin-si (KR); Sanghoon Baek, Seoul (KR); Sunyoung Park, Seoul (KR); Moo-Gyu Bae, Incheon (KR); Taejoong Song, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/829,650

(22) Filed: Aug. 19, 2015

(65) Prior Publication Data

US 2016/0056153 A1    Feb. 25, 2016

Related U.S. Application Data

(60) Provisional application No. 62/040,499, filed on Aug. 22, 2014.

(30) Foreign Application Priority Data

Dec. 11, 2014    (KR) .................. 10-2014-0178630

(51) Int. Cl.
| | |
|---|---|
| *H01L 29/76* | (2006.01) |
| *H01L 29/94* | (2006.01) |
| *H01L 27/088* | (2006.01) |
| *H01L 27/02* | (2006.01) |

(Continued)

(52) U.S. Cl.
CPC ......... *H01L 27/088* (2013.01); *H01L 27/0207* (2013.01); *H01L 27/11807* (2013.01); *H01L 29/0642* (2013.01); *H01L 2027/11874* (2013.01)

(58) Field of Classification Search
CPC ........... H01L 27/0207; H01L 27/1104; H01L 27/1116
USPC .......................................... 257/390; 365/154
See application file for complete search history.

(56) References Cited

U.S. PATENT DOCUMENTS

| | | | |
|---|---|---|---|
| 6,657,243 B2 * | 12/2003 | Kumagai et al. | 257/206 |
| 7,269,053 B2 | 9/2007 | Anezaki et al. | |

(Continued)

FOREIGN PATENT DOCUMENTS

| | | |
|---|---|---|
| JP | 4175649 B2 | 11/2008 |
| JP | 4291751 B2 | 7/2009 |

(Continued)

*Primary Examiner* — Theresa T Doan
(74) *Attorney, Agent, or Firm* — Muir Patent Law, PLLC

(57) ABSTRACT

A semiconductor device includes first and second gate structures extending in a first direction and spaced apart from each other in a second direction intersecting the first direction, a third gate structure extending in the first direction and provided between the first and second gate structures, a first contact connected to the first gate structure and having a first width in the second direction, a second contact connected to the second gate structure and having a second width in the second direction, and a third contact connected to the third gate structure and having a third width in the second direction. The first, second, and third contacts may be aligned with each other in the second direction to constitute one row. The first and second widths may be greater than the third width.

20 Claims, 19 Drawing Sheets

(51) Int. Cl.
*H01L 29/06* (2006.01)
*H01L 27/118* (2006.01)

(56) References Cited

U.S. PATENT DOCUMENTS

| | | | |
|---|---|---|---|
| 7,279,727 B2 | 10/2007 | Ikoma et al. | |
| 7,755,162 B2 | 7/2010 | Kurjanowicz et al. | |
| 8,188,549 B2 | 5/2012 | Ishii | |
| 8,908,455 B2 | 12/2014 | Takahashi et al. | |
| 2005/0263764 A1 | 12/2005 | Kim et al. | |
| 2013/0181309 A1 | 7/2013 | Johnson et al. | |
| 2013/0329487 A1* | 12/2013 | Asayama | 365/154 |
| 2014/0124923 A1 | 5/2014 | Cho | |

FOREIGN PATENT DOCUMENTS

| | | |
|---|---|---|
| JP | 2009-272340 A | 11/2009 |
| KR | 10-0674908 B1 | 1/2007 |
| KR | 10-2012-0043913 A | 5/2012 |

* cited by examiner

SEMICONDUCTOR DEVICES AND METHODS OF FORMING THE SAME

CROSS-REFERENCE TO RELATED APPLICATION

This U.S. non-provisional patent application claims priority under 35 U.S.C. §119 from U.S. Provisional Patent application Ser. No. 62/040,499, filed on Aug. 22, 2014 in the United States Patent and Trademark Office, and from Korean Patent Application No. 10-2014-0178630, filed on Dec. 11, 2014 in the Korean Intellectual Property Office, the disclosures of which are hereby incorporated by reference in their entirety.

BACKGROUND

The disclosed embodiments relate to semiconductor devices and methods of forming the same. More particularly, the disclosed embodiments relate to semiconductor devices including a plurality of standard cells and methods of forming the same.

Semiconductor devices are widely used in the electronic industry because of small sizes, multi-functional characteristics, and/or low manufacture costs. Semiconductor devices may be categorized as any one of semiconductor memory devices storing logical data, semiconductor logic devices processing operations of logical data, and hybrid semiconductor device having both the function of the semiconductor memory devices and the function of the semiconductor logic devices. Semiconductor devices with excellent characteristics have been demanded with the development of the semiconductor devices. For example, high-reliable, high-speed, and/or multi-functional semiconductor devices have been increasingly demanded. To satisfy these demands, structures of semiconductor devices have been complicated and semiconductor devices have been highly integrated.

SUMMARY

Embodiments of the inventive concepts may provide semiconductor devices capable of improving an integration density and methods of forming the same.

Embodiments of the inventive concepts may also provide semiconductor devices capable of minimizing performance deterioration and methods of forming the same.

Embodiments of the inventive concepts may further provide semiconductor devices capable of freely arranging via-contacts and methods of forming the same.

In one aspect, a semiconductor device may include a first gate structure and a second gate structure extending in a first direction and spaced apart from each other in a second direction intersecting the first direction on a substrate, a third gate structure extending in the first direction and provided between the first and second gate structures on the substrate, a first contact connected to the first gate structure and having a first width in the second direction, a second contact connected to the second gate structure and having a second width in the second direction, and a third contact connected to the third gate structure and having a third width in the second direction. The first contact, the second contact, and the third contact may be aligned with each other in the second direction to constitute one row. The first width and the second width may be greater than the third width.

In an embodiment, the semiconductor device may further include a dummy gate structure provided at a side of at least one of the first and second gate structures on the substrate. The dummy gate structure may extend in the first direction. The dummy gate structure may not be provided between the first, second, and third gate structures.

In an embodiment, the first contact may have a fourth width in the first direction, the second contact may have a fifth width in the first direction, and the third contact may have a sixth width in the first direction. The fourth width, the fifth width, and the sixth width may be equal to each other.

In an embodiment, the third gate structure may include a plurality of third gate structures, and the third contact may include a plurality of third contacts. The plurality of third contacts may be connected to the plurality of third gate structures, respectively.

In an embodiment, the semiconductor device may further include a dummy gate structure provided at a side of at least one of the first and second gate structures and extending in the first direction on the substrate. The dummy gate structure may not be provided between the first, second, and third gate structures.

In an embodiment, the semiconductor device may further include via-contacts connected to the first contact, the second contact, and the third contact, respectively. The via-contacts may apply a voltage to the first gate structure, the second gate structure, and the third gate structure through the first contact, the second contact, and the third contact.

In an embodiment, the first width may be equal to the second width.

In an embodiment, the first width may be different from the second width.

In an embodiment, the semiconductor device may further include a fourth gate structure spaced apart from the third gate structure in the second direction with one of the first and second gate structures interposed therebetween. The fourth gate structure may extend in the first direction on the substrate. One of the first and second contacts may extend in the second direction so as to be connected in common to the fourth gate structure and one of the first and second gate structures.

In an embodiment, top surfaces of the first, second, and third contacts may be disposed at the same level from the substrate.

In an embodiment, the first, second, and third contacts may be formed of the same material.

In an embodiment, the semiconductor device may further include a device isolation layer formed in the substrate to define active patterns. The active patterns may extend in the second direction and may be spaced apart from each other in the first direction, and each of the active patterns may include an upper portion exposed by the device isolation layer. The first, second, and third gate structures may be provided on the substrate to intersect the active patterns.

In an embodiment, the semiconductor device may further include source/drain regions provided in the active patterns at both sides of each of the first to third gate structures, and source/drain contacts connected to the source/drain regions. Top surfaces of the source/drain contacts may be disposed at the same level as top surfaces of the first, second, and third contacts.

In an embodiment, the source/drain contacts may be formed of the same material as the first, second, and third contacts.

In another aspect, a semiconductor device may include a first gate structure and a second gate structure extending in a first direction and spaced apart from each other in a second direction intersecting the first direction, a third gate structure extending in the first direction and provided between the first and second gate structures, active patterns disposed under the first to third gate structures to intersect the first to third gate structures, source/drain regions provided in the active patterns at both sides of each of the first to third gate structures, source/drain contacts connected to the source/drain regions, a first contact connected to the first gate structure and having a first width in the second direction, a second contact connected to the second gate structure and having a second width in the second direction, and a third contact connected to the third gate structure and having a third width in the second direction. Top surfaces of the source/drain contacts may be disposed at the same level as top surfaces of the first, second, and third contacts. The first contact, the second contact, and the third contact may be aligned with each other in the second direction to constitute one row. The first width and the second width may be greater than the third width.

In an embodiment, the source/drain contacts and the first to third contacts may be formed of the same material.

In an embodiment, the first contact may have a fourth width in the first direction, the second contact may have a fifth width in the first direction, and the third contact may have a sixth width in the first direction. The fourth width, the fifth width, and the sixth width may be equal to each other.

In an embodiment, the semiconductor device may further include a dummy gate structure provided at a side of at least one of the first and second gate structures on the substrate and extending in the first direction. The dummy gate structure may not be provided between the first, second, and third gate structures.

In an embodiment, the third gate structure may include a plurality of third gate structures, and the third contact may include a plurality of third contacts. The plurality of third contacts may be connected to the plurality of third gate structures, respectively.

In an embodiment, the semiconductor device may further include via-contacts connected to the first contact, the second contact, and the third contact, respectively. The via-contacts may apply a voltage to the first gate structure, the second gate structure, and the third gate structure through the first contact, the second contact, and the third contact.

BRIEF DESCRIPTION OF THE DRAWINGS

The inventive concepts will become more apparent in view of the attached drawings and accompanying detailed description.

DETAILED DESCRIPTION

Figure 1:
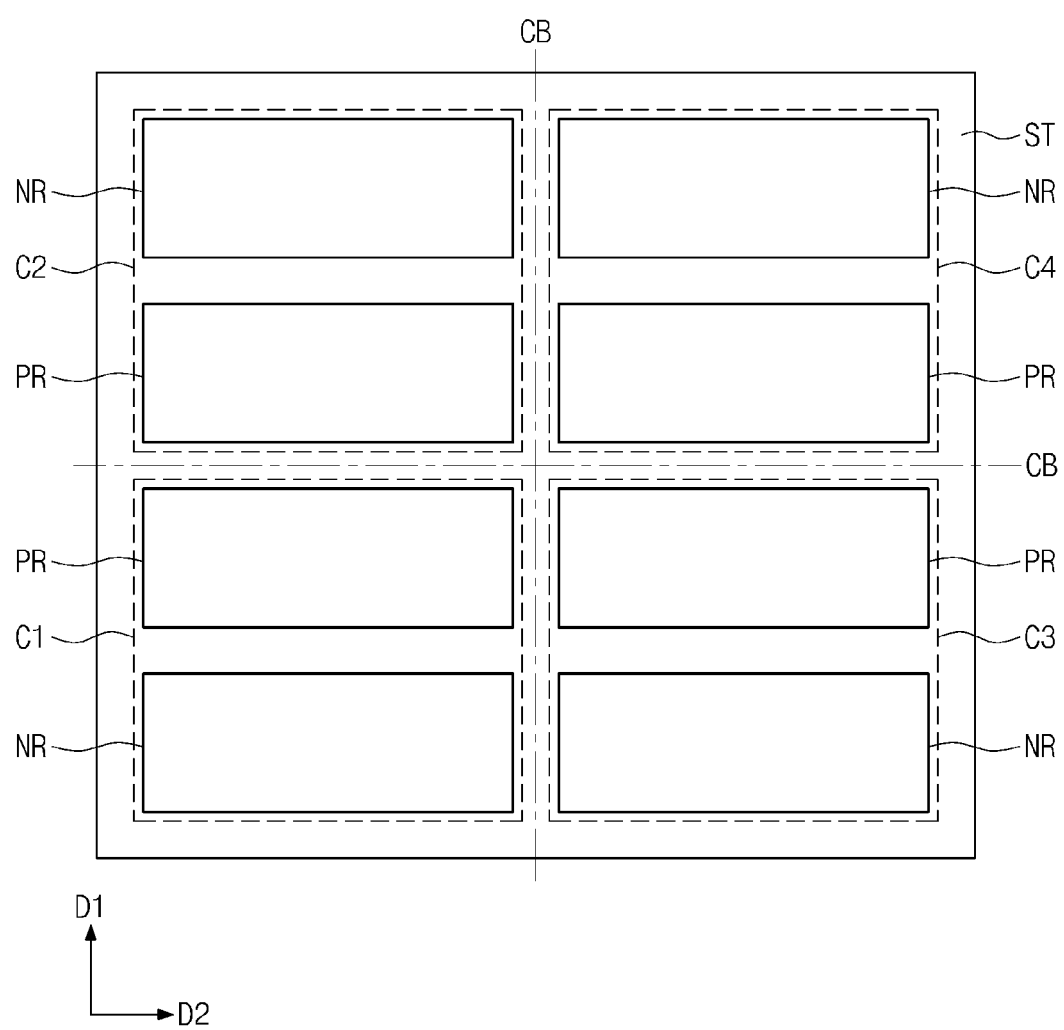
FIG. 1 is a plan view illustrating a semiconductor device according to example embodiments of the inventive concepts.

Various aspects of the inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the present disclosure. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. Also, the term "contact," as used herein refers to direct contact (i.e., touching) unless the context indicates otherwise.

It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limiting the scope of the inventive concepts.

It will be also understood that although the terms first, second, third etc. may be used herein to describe various elements, these elements should not be limited by these terms. Unless the context indicates otherwise, these terms are only used to distinguish one element from another element. Thus, a first element in some embodiments or in one section of the specification could be termed a second element in other embodiments or in another section of the specification without departing from the teachings of the present disclosure. In addition, in certain cases, even if a term is not described using "first," "second," etc., in the specification, it may still be referred to as "first" or "second" in a claim in order to distinguish different claimed elements from each other.

Exemplary embodiments of aspects of the present inventive concepts explained and illustrated herein include their complementary counterparts. The same reference numerals or the same reference designators denote the same or similar elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

FIG. 1 is a plan view illustrating a semiconductor device according to example embodiments of the inventive concepts.

Referring to FIG. 1, a semiconductor device according to embodiments of the inventive concepts may include a plurality of logic cells C1, C2, C3, and C4 provided on a substrate. Each of the logic cells C1, C2, C3, and C4 may include a plurality of transistors. In some embodiments, the semiconductor device may include a first logic cell C1, a second logic cell C2 spaced apart from the first logic cell C1 in a first direction D1, a third logic cell C3 spaced apart from the first logic cell C1 in a second direction D2 intersecting the first direction D1, and a fourth logic cell C4 spaced apart from the third logic cell C3 in the first direction D1. The fourth logic cell C4 may be spaced apart from the second logic cell C2 in the second direction D2. A cell boundary CB may be defined between the logic cells C1, C2, C3, and C4 adjacent to each other.

Each of the logic cells C1, C2, C3, and C4 may include active regions that are isolated from each other by a device isolation layer ST. Each of the logic cells C1, C2, C3, and C4 may include a P-type metal-oxide-semiconductor field effect transistor (PMOSFET) region PR and an N-type MOSFET (NMOSFET) region NR. The PMOSFET region PR and the NMOSFET region NR of each of the logic cells C1, C2, C3, and C4 may be separated from each other by the device isolation layer ST.

In some embodiments, the PMOSFET region PR and the NMOSFET region NR may be spaced apart from each other in the first direction D1. The PMOSFET region PR of the first logic cell C1 may be adjacent to the PMOSFET region PR of the second logic cell C2 in the first direction D1. In the present specification, the logic cell may be defined as a unit that performs one Boolean logic function (e.g., an INVERTER function, an AND function, an OR function, an NAND function, or an NOR function) or one storage function (e.g., a FLIP-FLOP function). Four logic cells C1, C2, C3, and C4 are illustrated in FIG. 1. However, the inventive concepts are not limited to these logic cells.

Figure 2:
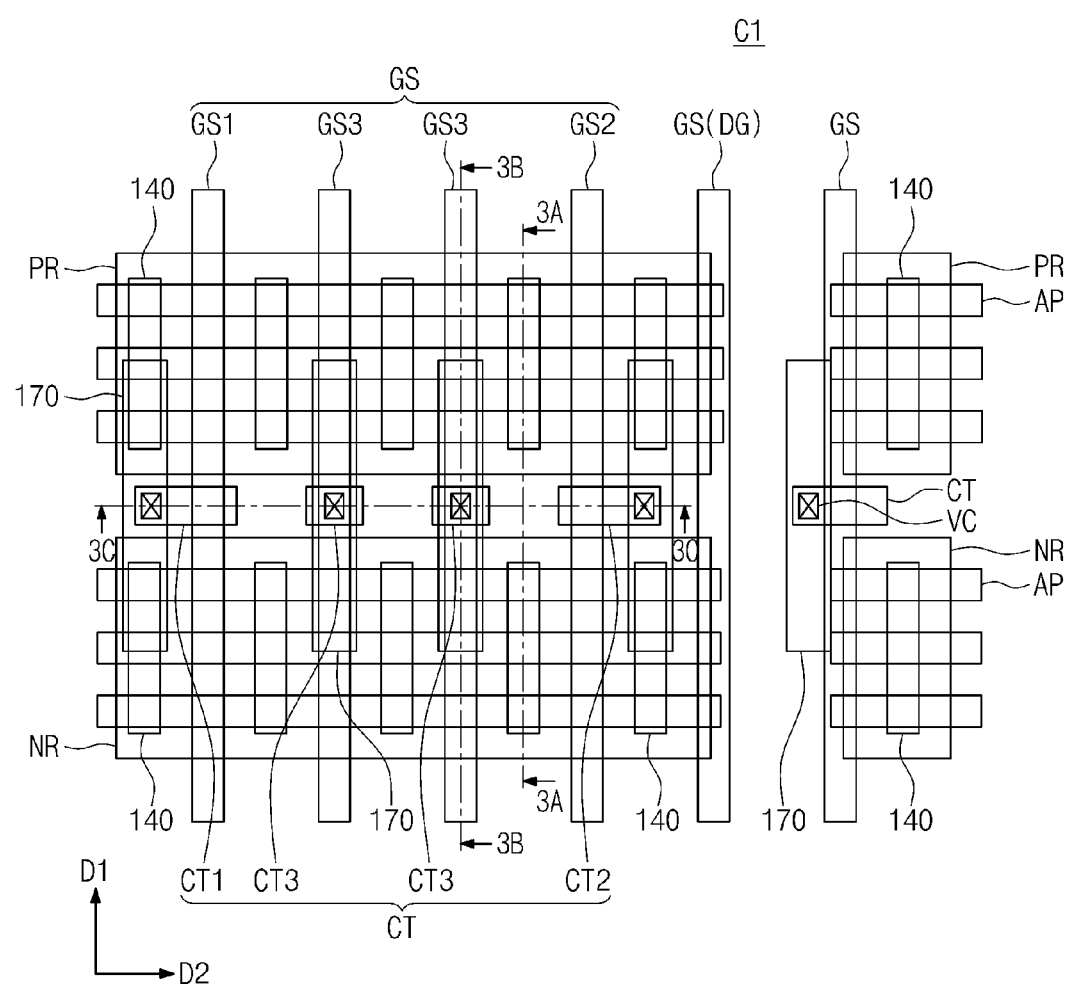
FIG. 2 is a plan view of a first logic cell of FIG. 1 to illustrate a semiconductor device according to some embodiments of the inventive concepts.
Figure 3A:
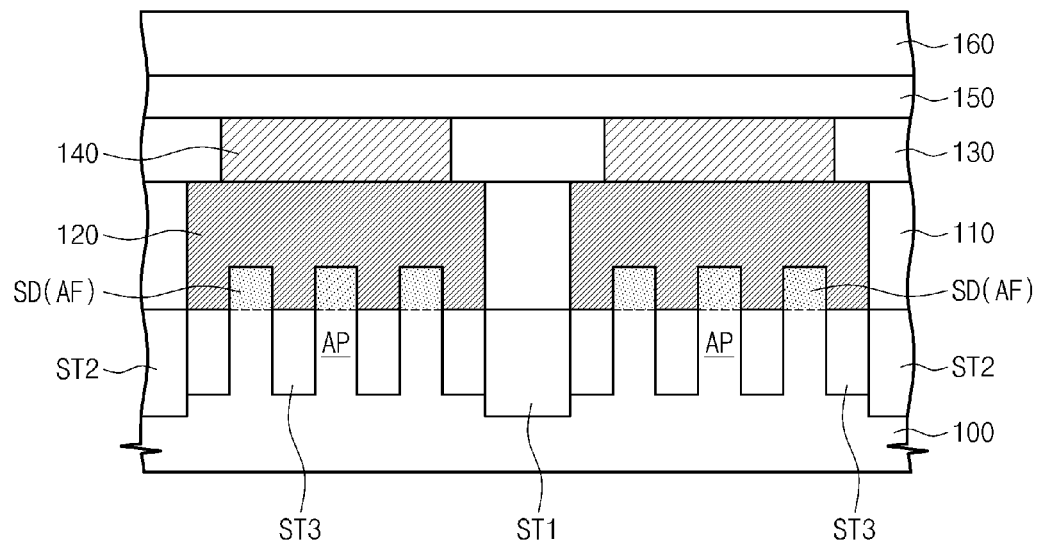
FIGS. 3A, 3B, and 3C are exemplary cross-sectional views taken along lines 3A-3A, 3B-3B, and 3C-3C of FIG. 2, respectively.
Figure 3B:
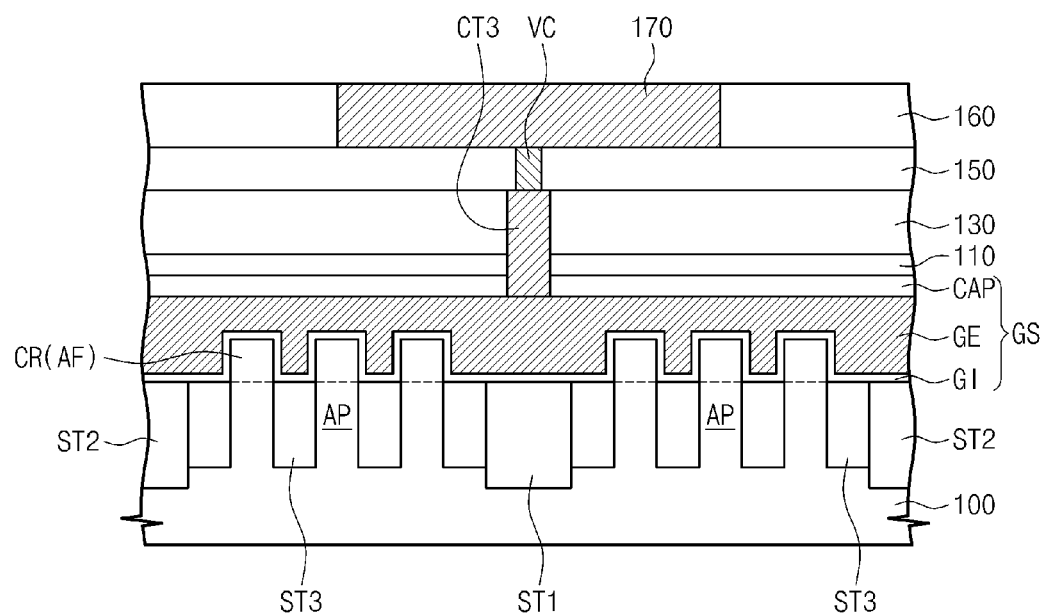
Figure 3C:
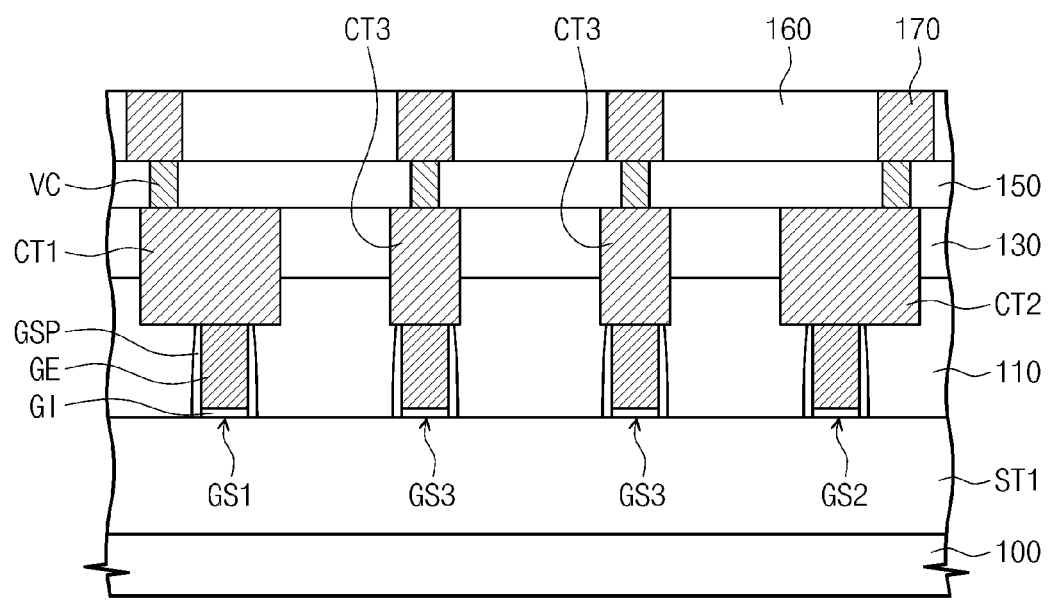
Figure 4:
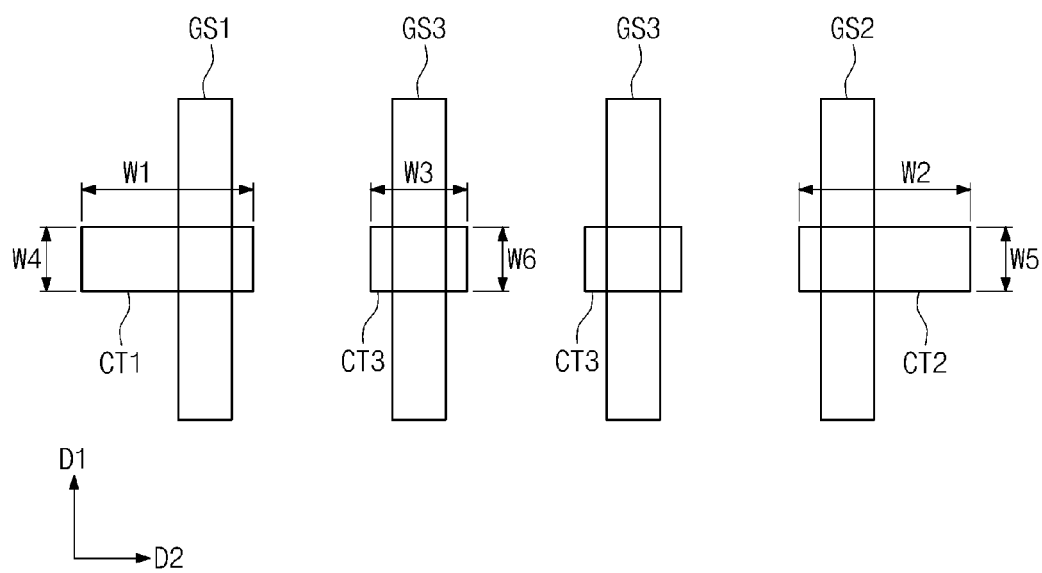
FIG. 4 is an exemplary plan view illustrating first, second, and third contacts of FIG. 2.

FIG. 2 is a plan view of a first logic cell C1 of FIG. 1 to illustrate a semiconductor device according to some embodiments of the inventive concepts. FIGS. 3A, 3B, and 3C are exemplary cross-sectional views taken along lines 3A-3A, 3B-3B, and 3C-3C of FIG. 2, respectively. FIG. 4 is an exemplary plan view illustrating first, second, and third contacts of FIG. 2. Hereinafter, embodiments of the inventive concepts will be described on the basis of the first logic cell C1. However, other logic cells C2, C3, and C4 may have the same structure as or a corresponding structure to the first logic cell C1.

Referring to FIGS. 1, 2, 3A, 3B, and 3C, the first logic cell C1 may include the PMOSFET region PR and the NMOSFET region NR, which are separated from each other by the device isolation layer ST. The first logic cell C1 may be separated from other logic cells C2, C3, and C4 adjacent thereto by the device isolation layer ST. The device isolation layer ST may include a first device isolation layer ST1 separating the PMOSFET region PR from the NMOSFET region NR and a second device isolation layer ST2 separating the first logic cell C1 from the neighboring logic cells C2, C3, and C4. The first device isolation layer ST1 and the second device isolation layer ST2 may be connected to each other to constitute one united body. In other words, the first and second device isolation layers ST1 and ST2 may correspond to portions of an insulating layer of one united body. The device isolation layer ST may be formed in an upper portion of the substrate 100. The substrate 100 may be, for example, a silicon substrate, a germanium substrate, or a silicon-on-insulator (SOI) substrate. The device isolation layer ST may include, for example, a silicon oxide layer.

According to an embodiment, the PMOSFET region PR and the NMOSFET region NR may be spaced apart from each other in the first direction D1 with the first device isolation layer ST1 interposed therebetween. Each of the PMOSFET region PR and the NMOSFET region NR may be one region. Alternatively, each of the PMOSFET region PR and the NMOSFET region NR may include a plurality of regions separated from each other by the first device isolation layer ST1, as illustrated in FIG. 2.

The first logic cell C1 may include a plurality of active patterns AP that are provided on the substrate 100 and may extend in the second direction D2. The active patterns AP may be arranged along the first direction D1. According to an embodiment, third device isolation layers ST3 extending in the second direction D2 may be disposed at both sides of each of the active patterns AP. In an embodiment, each of the active patterns AP may have an upper portion (hereinafter, referred to as 'an active fin AF') exposed by the third device isolation layers ST3. However, the inventive concepts are not limited thereto. In another embodiment, top surfaces of the active patterns AP may be substantially coplanar with top surfaces of the third device isolation layers ST3.

The first, second, and third device isolation layers ST1, ST2, and ST3 may have depths in a direction perpendicular to a top surface of the substrate 100. According to an embodiment, the depths of the third device isolation layers ST3 may be smaller than those of the first and second device isolation layers ST1 and ST2. In this case, the third device isolation layers ST3 may be formed by an additional process different from a process of forming the first and second device isolation layers ST1 and ST2. According to another embodiment, the third device isolation layers ST3 may be formed simultaneously with the first and second device isolation layers ST1 and ST2, and the depths of the third device isolation layers ST3 may be substantially equal to those of the first and second device isolation layers ST1 and ST2.

The active patterns AP may be provided on the PMOSFET region PR and the NMOSFET region NR. As illustrated in FIG. 2, three active patterns AP may be disposed on each of the PMOSFET region PR and the NMOSFET region NR. However, the inventive concepts are not limited thereto.

Gate structures GS may be disposed on the active patterns AP. The gate structures GS may extend in the first direction D1 to intersect the active patterns AP. The gate structures GS may extend in the first direction D1 to intersect the PMOSFET region PR and the NMOSFET region NR, and may be arranged in the second direction D2. Each of the gate structures GS may include a gate insulating pattern GI, a gate electrode GE, and a capping pattern CAP which are sequentially stacked on the substrate 100. The gate insulating pattern GI may include at least one of a silicon oxide layer, a silicon oxynitride layer, or a high-k dielectric layer of which a dielectric constant is higher than that of a silicon oxide layer. The gate electrode GE may include at least one of a doped semiconductor, a metal, or a conductive metal nitride. The capping pattern CAP may include at least one of a silicon oxide layer, a silicon nitride layer, or a silicon oxynitride layer. Gate spacers GSP may be provided on both sidewalls of each of the gate structures GS. The gate spacers GSP may include at least one of a silicon oxide layer, a silicon nitride layer, or a silicon oxynitride layer.

The gate structures GS may include a first gate structure GS1 and a second gate structure GS2 spaced apart from each other in the second direction D2, and at least one third gate structure GS3 disposed between the first gate structure GS1 and the second gate structure GS2. According to some embodiments, the third gate structure GS3 may be provided in plurality. For example, two third gate structures GS3 may be provided between the first and second gate structures GS1 and GS2, as illustrated in FIG. 2. However, the inventive concepts are not limited to the number of the third gate structures GS3 provided between the first and second gate structures GS1 and GS2. The first to third gate structures GS1, GS2, and GS3 may be continuously arranged along the second direction D2. For example, if the gate structures GS include at least one dummy gate structure DG as illustrated in FIG. 2, the dummy gate structure DG may not be provided between the first to third gate structures GS1, GS2, and GS3. In the present specification, the dummy gate structure DG may be defined as one of the gate structures GS which is not supplied with a gate voltage.

Source/drain regions SD may be provided in the active patterns AP at both sides of each of the gate structures GS. As illustrated in FIG. 3A, the source/drain regions SD may be confined in the active fins AF. Alternatively, the source/drain regions SD may extend downward into the substrate 100 disposed between the third device isolation layers ST3. The source/drain regions SD of the PMOSFET region PR may be P-type dopant regions, and the source/drain regions SD of the NMOSFET region NR may be N-type dopant regions. Portions of the active fins (e.g., portions of the active fins AF), which are disposed under and overlap with each of the gate structures GS, may be used as channel regions CR.

Connecting conductive patterns 120 may be provided at both sides of each of the gate structures GS. On the PMOSFET region PR, each of the connecting conductive patterns 120 may electrically connect the source/drain regions SD, which are spaced apart from each other in the first direction D1 with the third device isolation layer ST3 interposed therebetween, to each other. The connecting conductive patterns 120 may be in contact with the source/drain regions SD. The source/drain regions SD of the NMOSFET region NR may be connected to each other through the connecting conductive patterns 120 by the same way as described above. For example, on the NMOSFET region NR, each of the connecting conductive patterns 120 may electrically connect the source/drain regions SD, which are spaced apart from each other in the first direction D1, to each other.

The connecting conductive patterns 120 may include a metal silicide. For example, the connecting conductive patterns 120 may include at least one of titanium silicide, tantalum silicide, or tungsten silicide. Each of the connecting conductive patterns 120 may further include a metal layer. For example, the metal layer may include at least one of titanium, tantalum, or tungsten. In an embodiment, each of the connecting conductive patterns 120 may include a metal silicide layer and the metal layer disposed on the metal silicide layer.

A first interlayer insulating layer 110 may be provided on the substrate 100 to cover the gate structures GS and the connecting conductive patterns 120. According to an embodiment, top surfaces of the connecting conductive patterns 120 may be substantially coplanar with a top surface of the first interlayer insulating layer 110. The first interlayer insulating layer 110 may include at least one of a silicon oxide layer or a silicon oxynitride layer.

Source/drain contacts 140 may be provided at both sides of each of the gate structures GS. The source/drain contacts 140 may be electrically connected to the source/drain regions SD disposed at both sides of the gate structures GS through the connecting conductive patterns 120. The source/drain contacts 140 may have various shapes. In some embodiments, one or some of the source/drain contacts 140 may have a bar shape extending in the first direction D1 when viewed from a plan view. Even though not shown in the drawings, one or some of the source/drain contacts 140 may extend onto the device isolation layer ST to electrically connect the source/drain regions SD of the PMOSFET region PR to the source/drain regions SD of the NMOSFET region NR. The source/drain contacts 140 may include at least one of a doped semiconductor, a metal, or a conductive metal nitride. In some embodiments, the connecting conductive patterns 120 may be omitted. In this case, the source/drain contacts 140 may penetrate the first interlayer insulating layer 110 so as to be in contact with the source/drain regions SD. A source voltage or a drain voltage may be applied to the source/drain regions SD through the source/drain contacts 140.

Gate contacts CT electrically connected to the gate electrodes GE may be provided on the gate structures GS. The gate contacts CT may be connected to corresponding ones of the gate structures GS, respectively. Each of the gate contacts CT may be in contact with a top surface of the gate electrode GE of the corresponding gate structure GS. The gate contacts CT may include at least one of a doped semiconductor, a metal, or a conductive metal nitride. A gate voltage may be applied to the gate structures GS through the gate contacts CT. If the gate structures GS include at least one dummy gate structure DG as illustrated in FIG. 2, the gate contacts CT may not be electrically connected to the dummy gate structure DG. Therefore, in some embodiments, the gate contacts CT may not be provided on the dummy gate structure DG.

The gate contacts CT may include a first contact CT1 connected to the first gate structure GS1, a second contact CT2 connected to the second gate structure GS2, and a third contact CT3 connected to the third gate structure GS3. In the event that the third gate structure GS3 is provided in plurality, the third contact CT3 may be provided in plurality. In this case, the plurality of third contacts CT3 may be connected to the plurality of third gate structures GS3, respectively. The first contact CT1, the second contact CT2, and the third contact CT3 may be aligned with each other in the second direction D2 to constitute one row when viewed from a plan view. The first contact CT1, the second contact CT2, and the third contact CT3 may be formed of the same material. For example, the first, second, and third contacts CT1, CT2, and CT3 may include at least one of a doped semiconductor, a metal, or a conductive metal nitride.

Referring to FIG. 4, the first contact CT1 may have a first width W1 in the second direction D2, and the second contact CT2 may have a second width W2 in the second direction D2. The third contact CT3 may have a third width W3 in the second direction D2. The first width W1 and the second width W2 may be greater than the third width W3. In an embodiment, the first width W1 may be equal to the second width W2. In another embodiment, the first width W1 may be different from the second width W2.

In addition, the first contact CT1 may have a fourth width W4 in the first direction D1, and the second contact CT2 may have a fifth width W5 in the first direction D1. The third contact CT3 may have a sixth width W6 in the first direction D1. The fourth width W4, the fifth width W5, and the sixth width W6 may be equal to each other.

Referring again to FIGS. 1, 2, 3A, 3B, and 3C, the top surfaces of the source/drain contacts 140 and top surfaces of the gate contacts CT may be disposed at substantially the same level from the substrate 100. For example, the top surfaces of the first, second, and third contacts CT1, CT2, and CT3 may be disposed at the substantially same level from the substrate 100 and may be disposed at the substantially same level as the top surfaces of the source/drain contacts 140.

A second interlayer insulating layer 130 may be provided on the first interlayer insulating layer 110 to cover the source/drain contacts 140 and the gate contacts CT. The second interlayer insulating layer 130 may include at least one of a silicon oxide layer or a silicon oxynitride layer. The top surfaces of the source/drain contacts 140 and the top surfaces of the gate contacts CT may be disposed at substantially the same level as a top surface of the second interlayer insulating layer 130. For example, the top surfaces of the first, second, and third contacts CT1, CT2, and CT3 may be disposed at substantially the same level as the top surface of the second interlayer insulating layer 130.

A third interlayer insulating layer 150 may be provided on the second interlayer insulating layer 130, and via-contacts VC may be provided in the third interlayer insulating layer 150. The gate contacts CT may be connected to the via-contacts VC corresponding thereto, respectively. A fourth interlayer insulating layer 160 may be provided on the third interlayer insulating layer 150, and conductive lines 170 may be provided in the fourth interlayer insulating layer 160. The gate contacts CT may be electrically connected to the conductive lines 170 through the corresponding via-contacts VC. Even though not shown in the drawings, the source/drain contacts 140 may also be electrically connected to conductive lines (not shown) through via-contacts (not shown) corresponding to the source/drain contacts 140. Each of the third and fourth interlayer insulating layers 150 and 160 may include at least one of a silicon oxide layer or a silicon oxynitride layer. The via-contacts VC and the conductive lines 170 may include a conductive material.

According to embodiments of the inventive concepts, the first, second, and third contacts CT1, CT2, and CT3 respectively connected to the first, second, and third gate structures GS1, GS2, and GS3 may be aligned with each other in the second direction D2 in order to constitute one row. The first and second widths W1 and W2 of the first and second contacts CT1 and CT2 may be greater than the third width W3 of the third contact CT3. Since the dummy gate structure DG is not disposed between the first, second, and third gate structures GS1, GS2, and GS3, a cell area increase in the second direction D2 may be minimized to improve an integration density of the semiconductor device. In addition, since the first, second, and third contacts CT1, CT2, and CT3 are aligned with each other in the second direction D2 in order to constitute the one row, an area reduction of the active regions NR and PR adjacent to each other in the first direction D1 may be minimized. Thus, a performance reduction of the semiconductor device may be minimized. Furthermore, since the first and second widths W1 and W2 of the first and second contacts CT1 and CT2 are greater than the third width W3 of the third contact CT3, positions of the via-contacts VC may be relatively free on the first to third contacts CT1, CT2, and CT3.

Figure 5:
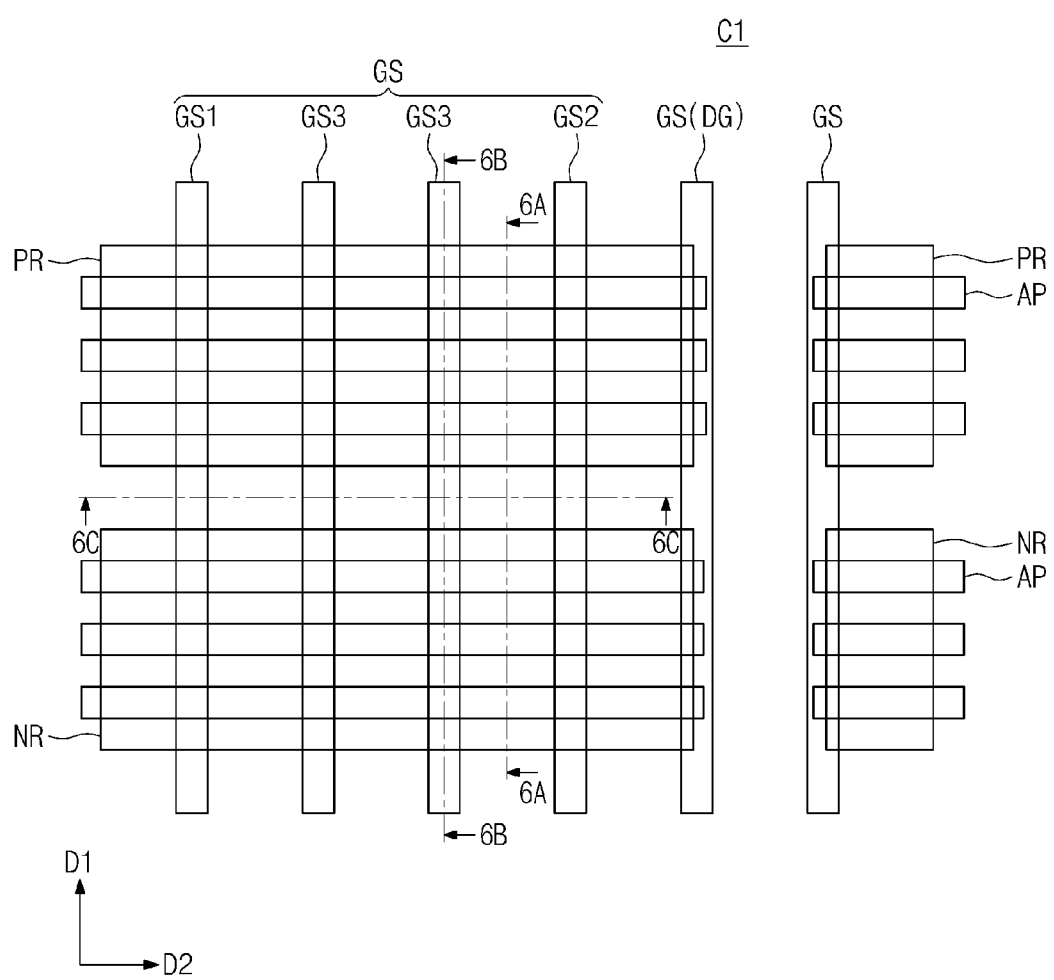
FIGS. 5, 7, and 9 are plan views corresponding to a first logic cell of FIG. 1 to illustrate a method of forming a semiconductor device according to some embodiments of the inventive concepts.
Figure 6A:
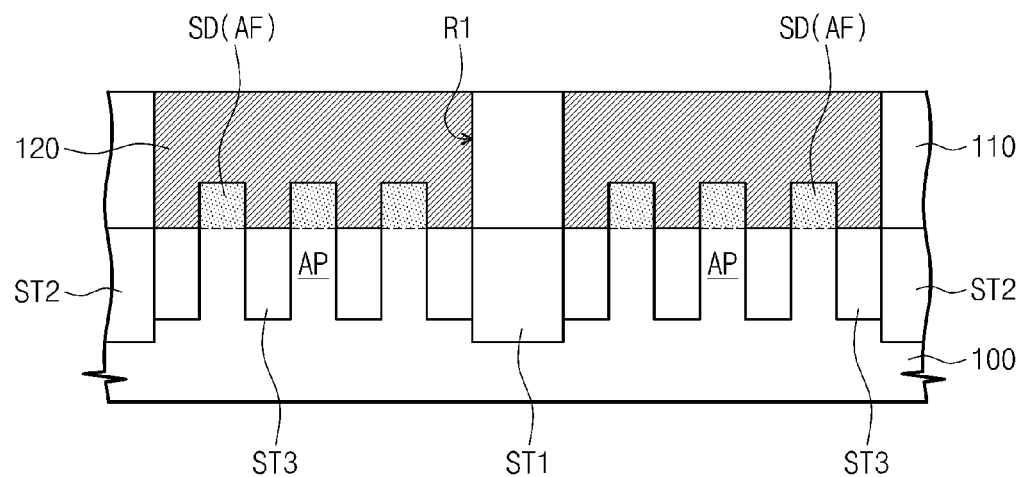
FIGS. 6A, 6B, and 6C are exemplary cross-sectional views taken along lines 6A-6A, 6B-6B, and 6C-6C of FIG. 5, respectively.
Figure 6B:
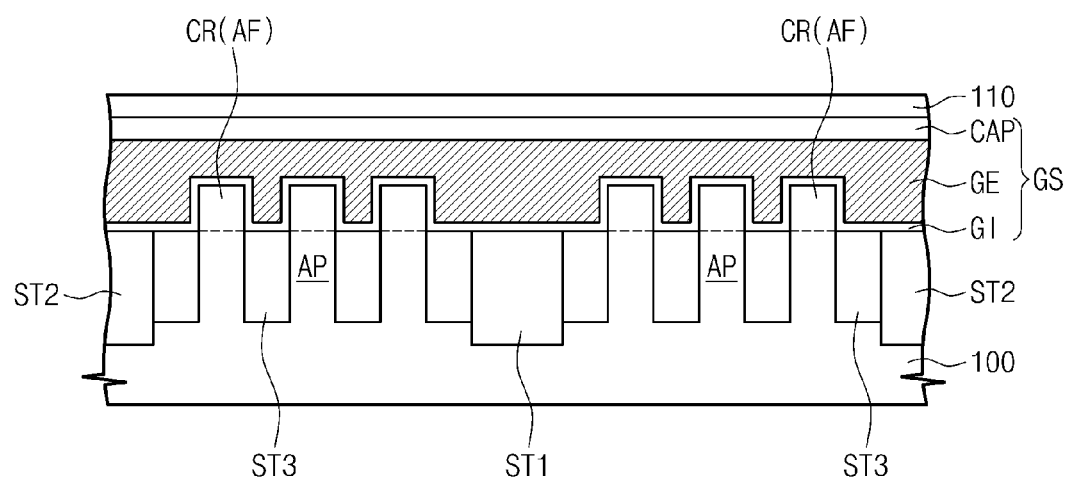
Figure 6C:
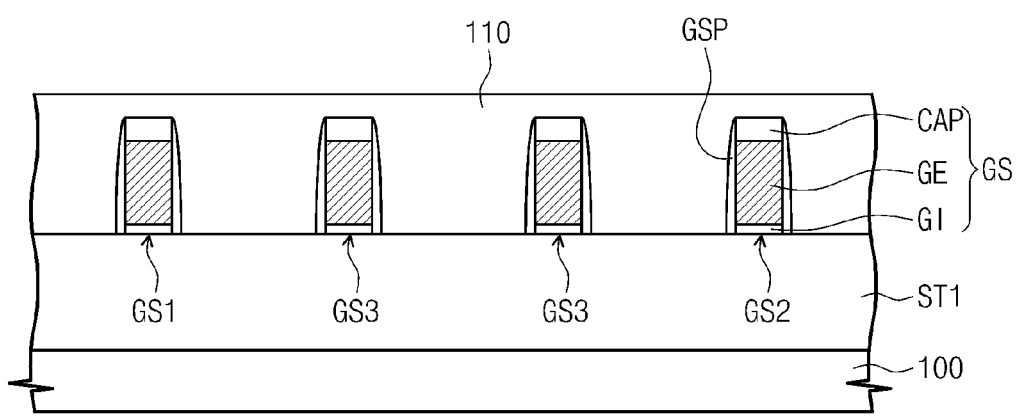
Figure 7:
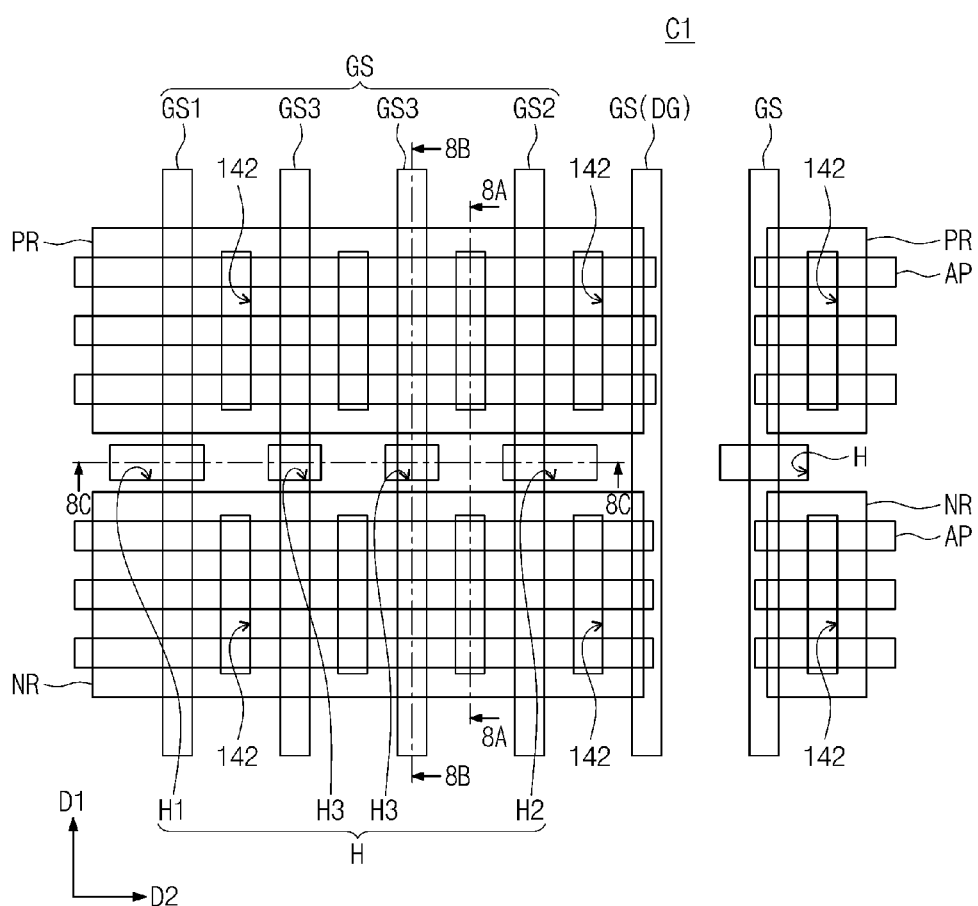
Figure 8A:
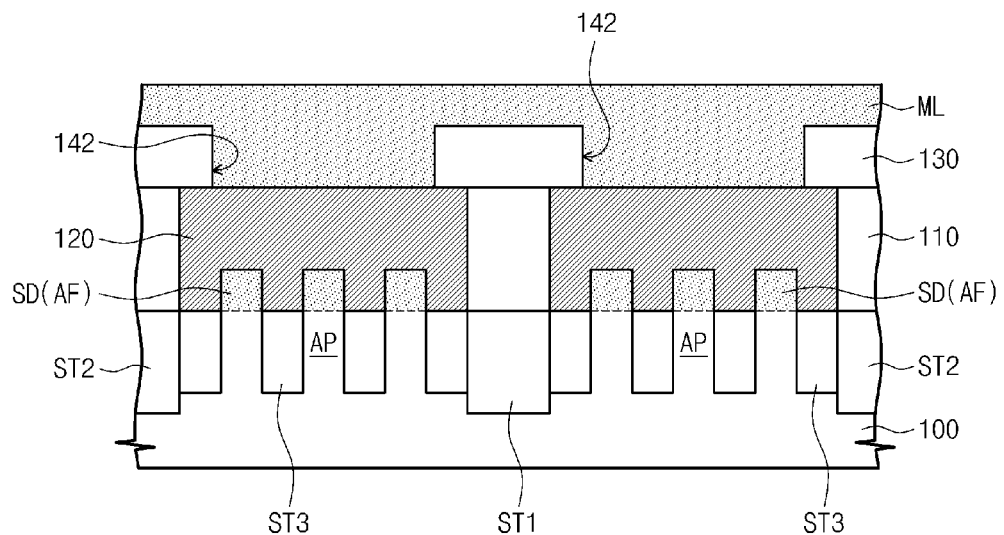
FIGS. 8A, 8B, and 8C are exemplary cross-sectional views taken along lines 8A-8A, 8B-8B, and 8C-8C of FIG. 7, respectively.
Figure 8B:
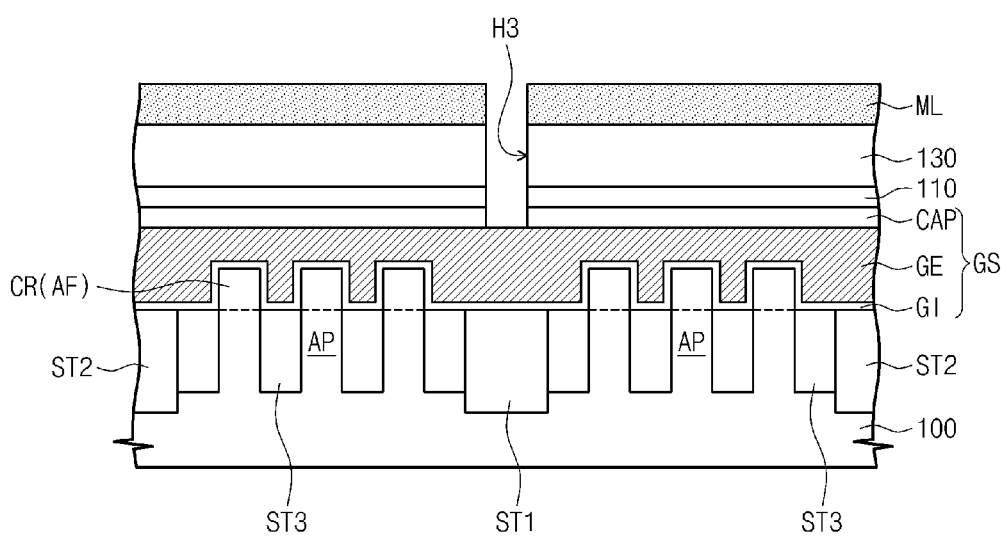
Figure 8C:
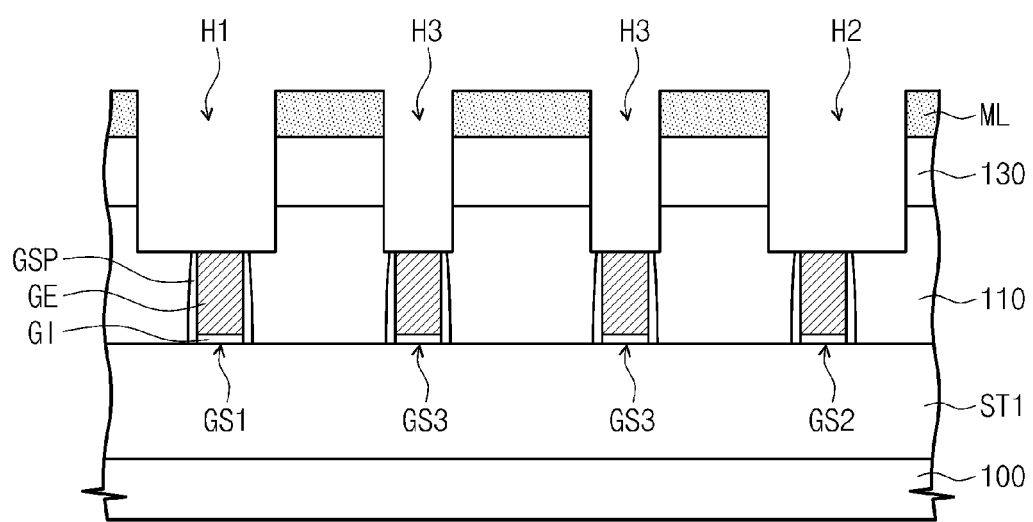
Figure 9:
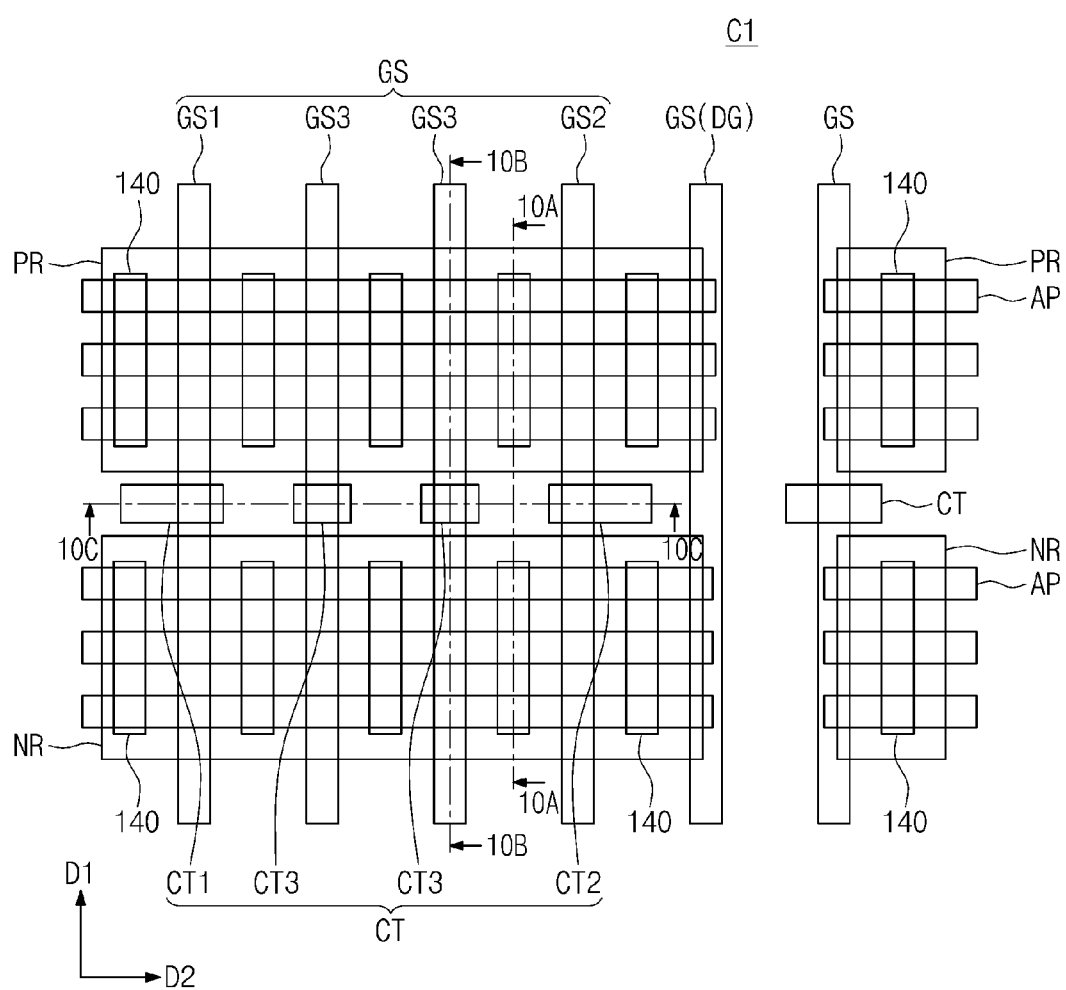
Figure 10A:
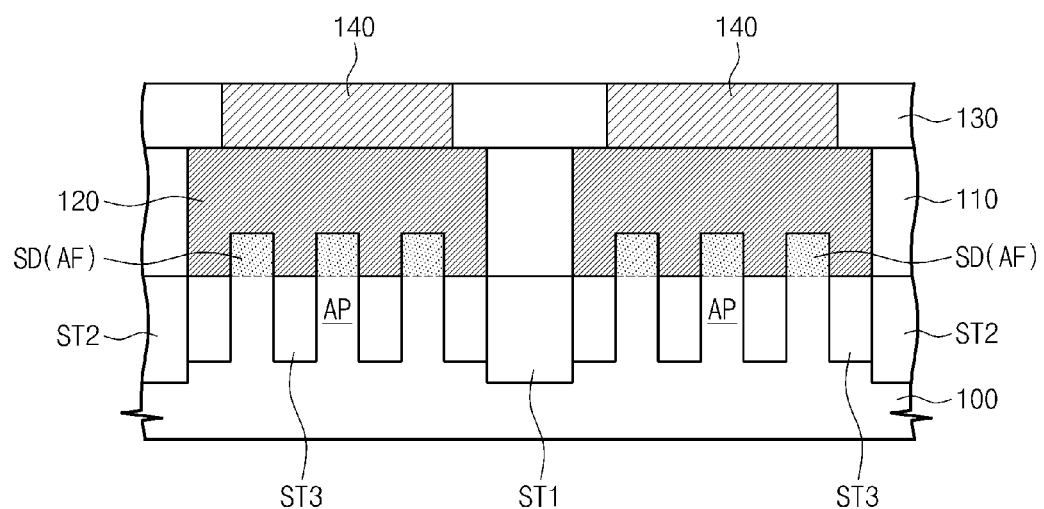
FIGS. 10A, 10B, and 10C are exemplary cross-sectional views taken along lines 10A-10A, 10B-10B, and 10C-10C of FIG. 9, respectively.
Figure 10B:
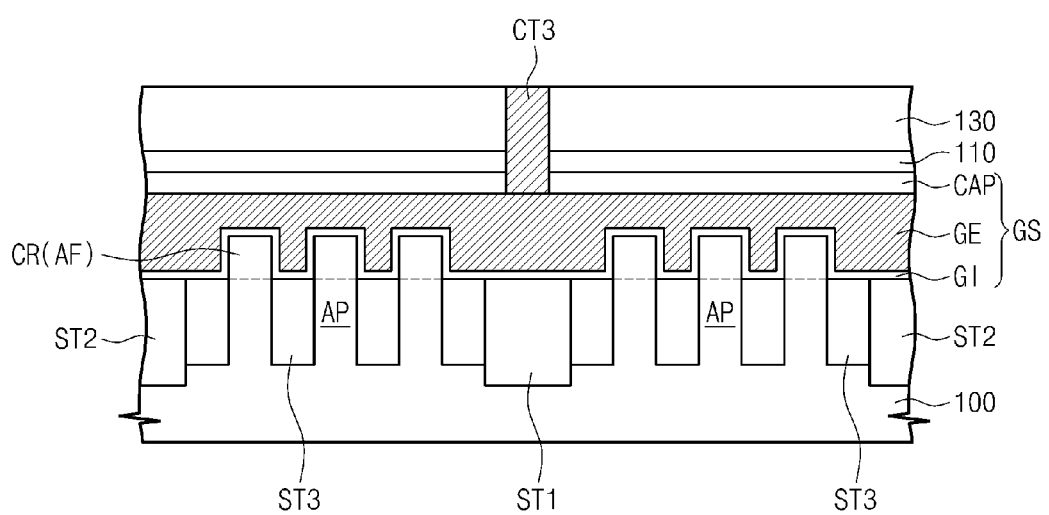
Figure 10C:
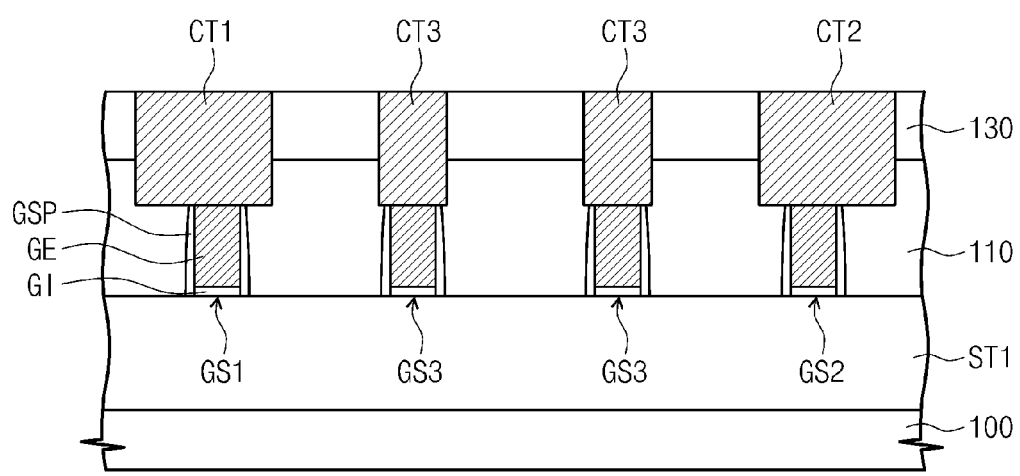

FIGS. 5, 7, and 9 are plan views corresponding to a first logic cell C1 of FIG. 1 to illustrate a method of forming a semiconductor device according to some embodiments of the inventive concepts. FIGS. 6A, 6B, and 6C are exemplary cross-sectional views taken along lines 6A-6A, 6B-6B, and 6C-6C of FIG. 5, respectively. FIGS. 8A, 8B, and 8C are exemplary cross-sectional views taken along lines 8A-8A, 8B-8B, and 8C-8C of FIG. 7, respectively. FIGS. 10A, 10B, and 10C are exemplary cross-sectional views taken along lines 10A-10A, 10B-10B, and 10C-10C of FIG. 9, respectively.

Referring to FIGS. 5, 6A, 6B, and 6C, a first device isolation layer ST1 and a second device isolation layer ST2 may be formed in a substrate 100. The substrate 100 may be, for example, a silicon substrate, a germanium substrate, or an SOI substrate. The first device isolation layer ST1 may extend in the second direction D2 to isolate a PMOSFET region PR and an NMOSFET region NR of a first logic cell C1 from each other. The second device isolation layer ST2 may extend in the second direction D2 to isolate the first logic cell C1 from neighboring logic cells. The first and second device isolation layers ST1 and ST2 may have depths in a direction perpendicular to a top surface of the substrate 100. In an embodiment, the depth of the second device isolation layer ST2 may be greater than that of the first device isolation layer ST1. In another embodiment, the depth of the second device isolation layer ST2 may be equal to that of the first device isolation layer ST1. The first and second device isolation layers ST1 and ST2 may be formed by a shallow-trench isolation (STI) process.

Third device isolation layers ST3 may be formed in the substrate 100. The third device isolation layers ST3 may extend in the second direction D2 to define active patterns AP on the PMOSFET and NMOSFET regions PR and NR. In an embodiment, each of the active patterns AP may have an upper portion (e.g., an active fine AF) exposed by the third device isolation layers ST3. The third device isolation layers ST3 may be formed by an STI process. The third device isolation layer ST3 may have a depth in the direction perpendicular to the top surface of the substrate 100. In an embodiment, the depth of the third device isolation layer ST3 may be smaller than those of the first and second device isolation layers ST1 and ST2. In another embodiment, the first to third device isolation layers ST1, ST2, and ST3 may be formed at the same time in order to have the same depth. The first to third device isolation layers ST1, ST2, and ST3 may include, for example, a silicon oxide layer.

Gate structures GS may be formed on the substrate 100. The gate structures GS may intersect the active patterns AP and may extend in the first direction D1. Each of the gate structures GS may include a gate insulating pattern GI, a gate electrode GE, and a capping pattern CAP which are sequentially stacked on the substrate 100. In some embodiments, a gate insulating layer, a gate electrode layer, and a capping layer may be sequentially formed on the substrate 100. The capping layer, the gate electrode layer, and the gate insulating layer may be successively patterned to form the capping pattern CAP, the gate electrode GE, and the gate insulating pattern GI. The gate insulating pattern GI may include at least one of a silicon oxide layer, a silicon oxynitride layer, or a high-k dielectric layer of which a dielectric constant is higher than that of a silicon oxide layer. The gate electrode GE may include at least one of a doped semiconductor, a metal, or a conductive metal nitride. The capping pattern CAP may include at least one of a silicon oxide layer, a silicon nitride layer, or a silicon oxynitride layer. Each of the gate insulating layer, the gate electrode layer and the capping layer may be formed by a chemical vapor deposition (CVD) process and/or a sputtering process.

Gate spacers GSP may be formed on both sidewalls of each of the gate structures GS. In some embodiments, a spacer layer may be formed to cover the gate structures GS, and the spacer layer may be anisotropically etched to form the gate spacers GSP. The spacer layer may include at least one of a silicon oxide layer, a silicon nitride layer, or a silicon oxynitride layer.

The gate structures GS may include a first gate structure GS1 and a second gate structure GS2 spaced apart from each other in the second direction D2, and may also include at least one third gate structure GS3 disposed between the first gate structure GS1 and the second gate structure GS2. The first to third gate structures GS1, GS2, and GS3 may be continuously arranged along the second direction D2. For example, if the gate structures GS include at least one dummy gate structure DG as illustrated in FIG. 5, the dummy gate structure DG may not be provided between the first to third gate structures GS1, GS2, and GS3. The dummy gate structure DG may be defined as one of the gate structures GS which is not supplied with a gate voltage.

Ion implantation processes may be performed on the substrate 100 having the gate structures GS in order to form source/drain regions SD. The source/drain regions SD may be formed in the active patterns AP at both sides of each of the gate structures GS. The source/drain regions SD of the PMOSFET region PR may be formed by implanting P-type dopant ions, and the source/drain regions SD of the NMOSFET region NR may be formed by implanting N-type dopant ions. The source/drain regions SD may not be formed in portions of the active patterns which are disposed under the gate structures GS to overlap with the gate structures GS. The portions of the active patterns AP, which are disposed under and overlap with the gate structures GS, may be used as channel regions CR.

A first interlayer insulating layer 110 may be formed on the substrate 100 to cover the gate structures GS. The first interlayer insulating layer 110 may include at least one of a silicon oxide layer or a silicon oxynitride layer. Connecting conductive patterns 120 may be formed in the first interlayer insulating layer 110. The connecting conductive patterns 120 may penetrate the first interlayer insulating layer 110 so as to be connected to the source/drain regions SD. Forming the connecting conductive patterns 120 may include forming recess regions R1 that penetrate the first interlayer insulating layer 110 in order to expose the active patterns AP at both sides of each of the gate structures GS, forming a conductive material filling the recess regions R1 on the first interlayer insulating layer 110, and planarizing the conductive material until the first interlayer insulating layer 110 is exposed. The connecting conductive patterns 120 may include a metal silicide. For example, the connecting conductive patterns 120 may include at least one of titanium silicide, tantalum silicide, or tungsten silicide. Each of the connecting conductive patterns 120 may further include a metal layer. For example, the metal layer may include at least one of titanium, tantalum, or tungsten. In an embodiment, each of the connecting conductive patterns 120 may include a metal silicide layer and the metal layer disposed on the metal silicide layer.

On the PMOSFET region PR, each of the connecting conductive patterns 120 may electrically connect the source/drain regions SD, which are spaced apart from each other in the first direction D1 with the third device isolation layer ST3 interposed therebetween, to each other. The source/drain regions SD of the NMOSFET region NR may be connected to each other through the connecting conductive patterns 120 by the same way as described above. In other words, on the NMOSFET region NR, each of the connecting conductive patterns 120 may electrically connect the source/drain regions SD, which are spaced apart from each other in the first direction D1 with the third device isolation layer ST3 interposed therebetween, to each other. Top surfaces of the connecting conductive patterns 120 may be higher than those of the gate structures GS.

Referring to FIGS. 7, 8A, 8B, and 8C, a second interlayer insulating layer 130 may be formed on the substrate 100 having the connecting conductive patterns 120. The second interlayer insulating layer 130 may include at least one of a silicon oxide layer or a silicon oxynitride layer.

The second interlayer insulating layer 130 may be patterned to form source/drain contact holes 142 that expose the connecting conductive patterns 120 at both sides of each of the gate structures GS. Each of the source/drain contact holes 142 may extend along a top surface of each of the connecting conductive patterns 120 in the first direction D1. Even though not shown in the drawings, at least one of the source/drain contact holes 142 may extend onto the device isolation layer ST to expose a top surface of one of the connecting conductive patterns 120 of the PMOSFET region PR and a top surface of one of the connecting conductive patterns 120 of the NMOSFET region NR at the same time. In some embodiments, the process of forming the connecting conductive patterns 120 may be omitted. In this case, the source/drain contact holes 142 may penetrate the first interlayer insulating layer 110 to expose the source/drain regions SD at both sides of each of the gate structures GS.

A mask layer ML may be formed on the second interlayer insulating layer 130 to fill the source/drain contact holes 142. For example, the mask layer ML may include a spin-on-hardmask (SOH) material.

The mask layer ML, the second interlayer insulating layer 130, and the first interlayer insulating layer 110 may be successively patterned to form gate contact holes H exposing the gate structures GS. Each of the gate contact holes H may expose the gate electrode GE of a corresponding one of the gate structures GS. If the gate structures GS include at least one dummy gate structure DG as illustrated in FIG. 7, the gate contact hole H may not be provided on the dummy gate structure DG.

The gate contact holes H may include a first contact hole H1 exposing the first gate structure GS1, a second contact hole H2 exposing the second gate structure GS2, and a third contact hole H3 exposing the third gate structure GS3. The first, second, and third contact holes H1, H2, and H3 may be aligned with each other in the second direction D2 to constitute one row when viewed from a plan view. In the second direction D2, the first and second contact holes H1 and H2 may be longer than the third contact hole H3. Widths of the first to third contact holes H1, H2, and H3 in the first direction D1 may be substantially equal to each other.

Referring to FIGS. 9, 10A, 10B, and 10C, the mask layer ML may be removed. For example, the mask layer ML may be removed using an ashing process and/or a strip process. Thereafter, a conductive layer may be formed on the second interlayer insulating layer 130 to fill the source/drain contact holes 142 and the gate contact holes H. The conductive layer may include, for example, at least one of a doped semiconductor layer, a metal layer, or a conductive metal nitride layer. The conductive layer may be planarized until the second interlayer insulating layer 130 is exposed, thereby forming source/drain contacts 140 and gate contacts CT in the source/drain contact holes 142 and the gate contact holes H, respectively.

The gate contacts CT may include a first contact CT1 connected to the first gate structure GS1, a second contact CT2 connected to the second gate structure GS2, and a third contact CT3 connected to the third gate structure GS3. The first contact CT1, the second contact CT2, and the third contact CT3 may be aligned with each other in the second direction D2 to constitute one row when viewed from a plan view. As described with reference to FIG. 4, the first and second widths W1 and W2 of the first and second contacts CT1 and CT2 may be greater than the third width W3 of the third contact W3. In an embodiment, the first width W1 may be equal to the second width W2. Alternatively, in another embodiment, the first width W1 may be different from the second width W2. In addition, the fourth width W4 of the first contact CT1, the fifth width W5 of the second contact CT2, and the sixth width W6 of the third contact CT3 may be equal to each other.

Due to the planarization process of the conductive layer, top surfaces of the source/drain contacts 140 and top surfaces of the gate contacts CT may be disposed at the same level from the substrate 100. For example, the top surfaces of the first, second, and third contacts CT1, CT2, and CT3 may be disposed at the same level from the substrate 100. The top surfaces of the first, second, and third contacts CT1, CT2, and CT3 may be disposed at the same level as the top surfaces of the source/drain contacts 140.

Referring again to FIGS. 2, 3A, 3B, and 3C, a third interlayer insulating layer 150 may be formed on the second interlayer insulating layer 130, the source/drain contacts 140, and the gate contacts CT. Via-contacts VC may be formed to penetrate the third interlayer insulating layer 150. The gate contacts CT may be connected to corresponding via-contacts VC, respectively. A fourth interlayer insulating layer 160 covering the via-contacts VC may be formed on the third interlayer insulating layer 150. Conductive lines 170 may be formed in the fourth interlayer insulating layer 160. The conductive lines 170 may penetrate the fourth interlayer insulating layer 160 so as to be connected to the via-contacts VC. The gate contacts CT may be electrically connected to the conductive lines 170 through the corresponding via-contacts VC. Even though not shown in the drawings, the source/drain contacts 140 may be electrically connected to conductive lines (not shown) through via-contacts (not shown) corresponding to the source/drain contacts 140. Each of the third and fourth interlayer insulating layers 150 and 160 may include at least one of a silicon oxide layer or a silicon oxynitride layer. The via-contacts VC and the conductive lines 170 may include a conductive material.

Figure 11:
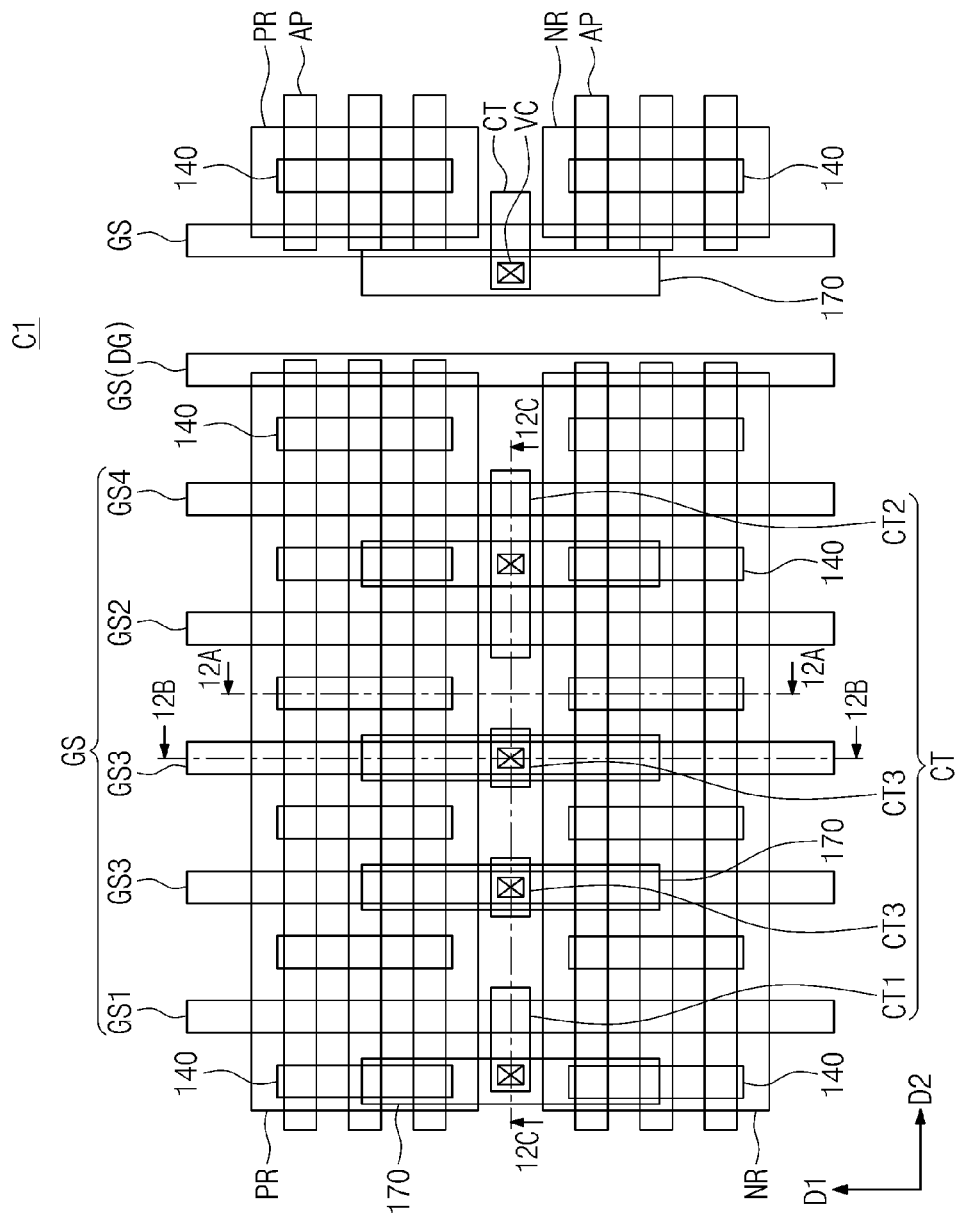
FIG. 11 is a plan view of a first logic cell of FIG. 1 to illustrate a semiconductor device according to other embodiments of the inventive concepts.
Figure 12A:
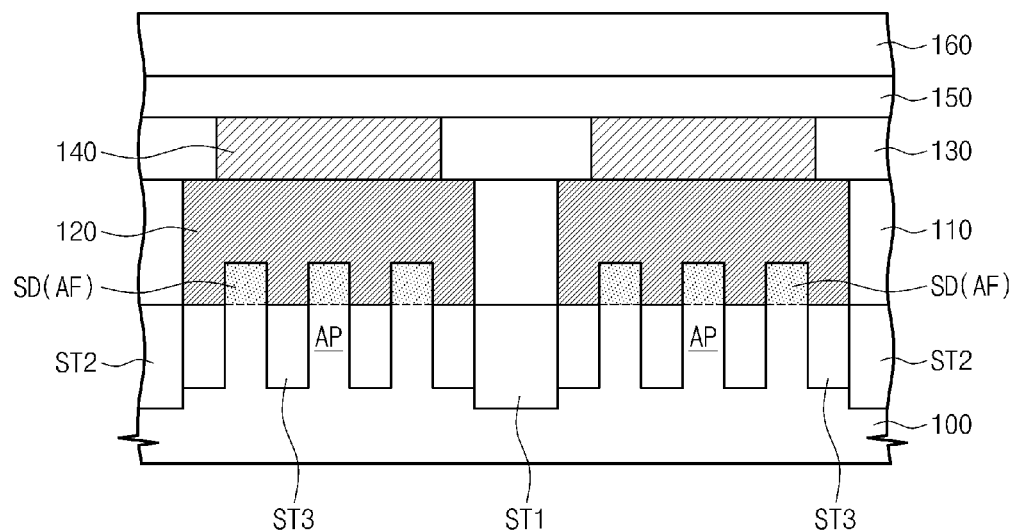
FIGS. 12A, 12B, and 12C are exemplary cross-sectional views taken along lines 12A-12A, 12B-12B, and 12C-12C of FIG. 11, respectively.
Figure 12B:
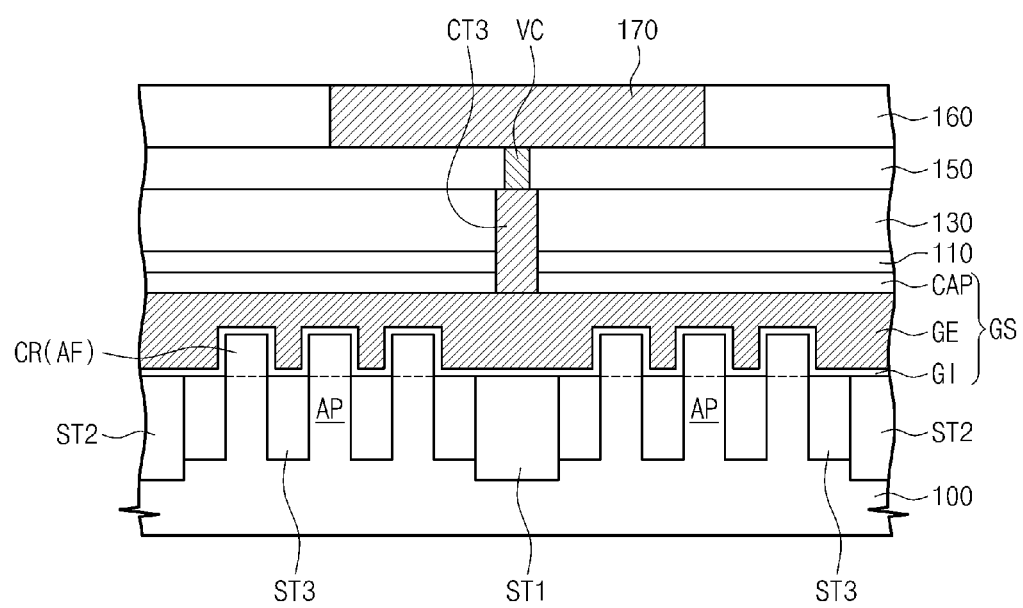
Figure 12C:
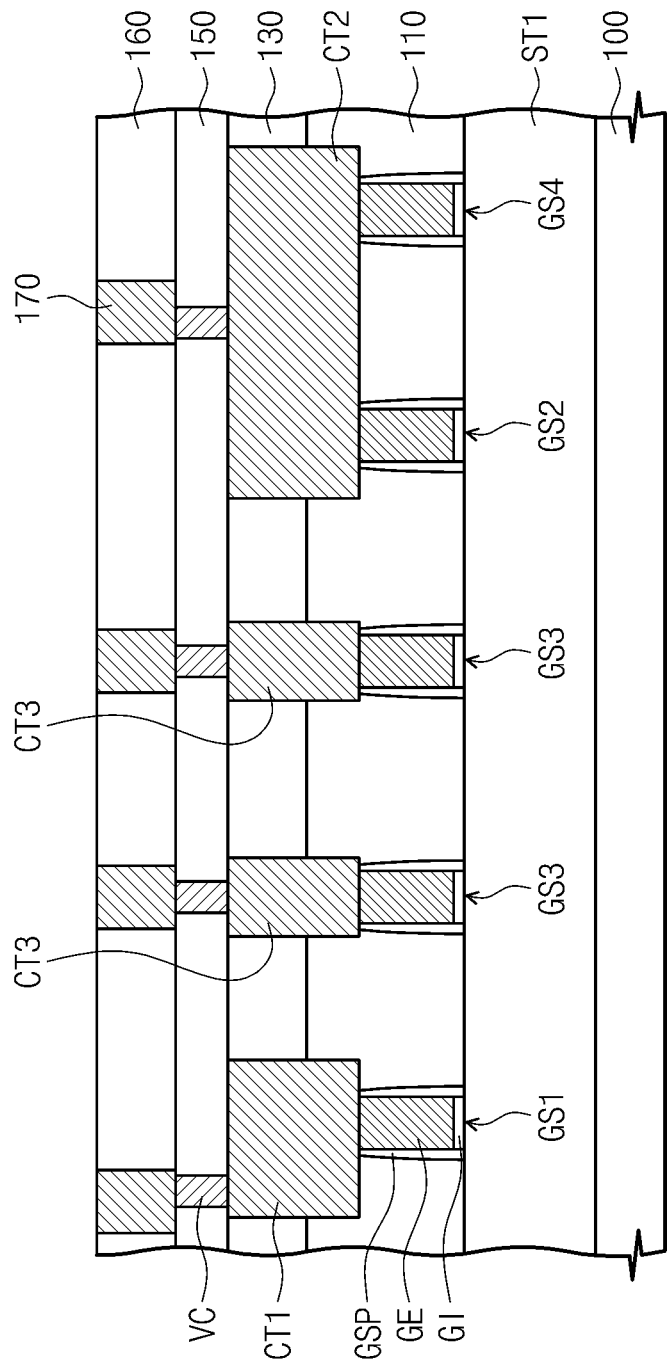

FIG. 11 is a plan view of a first logic cell of FIG. 1 to illustrate a semiconductor device according to other embodiments of the inventive concepts. FIGS. 12A, 12B, and 12C are cross-sectional views taken along lines 12A-12A, 12B-12B, and 12C-12C of FIG. 11, respectively. In the present embodiment, the same elements as described in the embodiment of FIGS. 1, 2, and 3A to 3C will be indicated by the same reference numerals or the same reference designators. The descriptions to the same elements as in the embodiment of FIGS. 1, 2, and 3A to 3C will be omitted or mentioned briefly for the purpose of ease and convenience in explanation.

Referring to FIGS. 1, 11, 12A, 12B, and 12C, the first logic cell C1 may include a plurality of active patterns AP that are provided on a substrate 100 and extend in the second direction D2. The active patterns AP may be arranged along the first direction D1. Gate structures GS may be provided on the active patterns AP. The gate structures GS may intersect the active patterns AP and may extend in the first direction D1.

The gate structures GS may include first and second gate structures GS1 and GS2 spaced apart from each other in the second direction D2, and at least one third gate structure GS3 disposed between the first and second gate structures GS1 and GS2. According to some embodiments, the third gate structure GS3 may be provided in plurality. For example, two third gate structures GS3 may be provided between the first and second gate structures GS1 and GS2, as illustrated in FIG. 11. However, the inventive concepts are not limited to the number of the third gate structures GS3 provided between the first and second gate structures GS1 and GS2.

According to the present embodiment, the gate structures GS may further include a fourth gate structure GS4 that is spaced apart from the third gate structure GS3 in the second direction D2 with one of the first and second gate structures GS1 and GS2 interposed therebetween. For example, one of the first and second gate structures GS1 and GS2 may be disposed between the third gate structure GS3 and the fourth gate structure GS4. The first to fourth gate structures GS1, GS2, GS3, and GS4 may be continuously arranged along the second direction D2. For example, if the gate structures GS include at least one dummy gate structure DG as illustrated in FIG. 11, the dummy gate structure DG may not be provided between the first to fourth gate structures GS1, GS2, GS3, and GS4.

Source/drain regions SD may be provided in the active patterns AP at both sides of each of the gate structures GS. Connecting conductive patterns 120 may be provided at both sides of each of the gate structures GS. On the PMOSFET region PR, each of the connecting conductive patterns 120 may electrically connect the source/drain regions SD, which are spaced apart from each other in the first direction D1, to each other. The connecting conductive patterns 120 may be in contact with the source/drain regions SD. Likewise, on the NMOSFET region NR, each of the connecting conductive patterns 120 may electrically connect the source/drain regions SD, which are spaced apart from each other in the first direction D1, to each other. A first interlayer insulating layer 110 covering the gate structures GS and the connecting conductive patterns 120 may be provided on the substrate 100. In an embodiment, top surfaces of the connecting conductive patterns 120 may be substantially coplanar with a top surface of the first interlayer insulating layer 110.

Source/drain contacts 140 may be provided at both sides of each of the gate structures GS. The source/drain contacts 140 may be electrically connected to the source/drain regions SD, disposed at both sides of the gate structures GS, through the connecting conductive patterns 120. In some embodiments, the connecting conductive patterns 120 may be omitted. In this case, the source/drain contacts 140 may penetrate the first interlayer insulating layer 110 so as to be in direct contact with the source/drain regions SD.

Gate contacts CT may be provided on the gate structures GS. The gate contacts CT may be electrically connected to the gate structures GS (e.g., the gate electrodes GE). The gate contacts CT may be connected to corresponding ones of the gate structures GS, respectively. Each of the gate contacts CT may be in contact with a top surface of the gate electrode GE of the corresponding gate structure GS. If the gate structures GS include at least one dummy gate structure DG as illustrated in FIG. 11, the gate contacts CT may not be electrically connected to the dummy gate structure DG. In other words, the gate contacts CT may not be provided on the dummy gate structure DG.

The gate contacts CT may include a first contact CT1 connected to the first gate structure GS1, a second contact CT2 connected to the second gate structure GS2, and a third contact CT3 connected to the third gate structure GS3. If the third gate structure GS3 is provided in plurality, the third contact CT3 may also be provided in plurality. In this case, the plurality of third contacts CT3 may be connected to the plurality of third gate structures GS3, respectively.

According to the present embodiment, one of the first and second contacts CT1 and CT2 may extend in the second direction D2 so as to be connected in common to the fourth gate structure GS4 and to one of the first and second gate structures GS1 and GS2. In some embodiments, if the fourth gate structure GS4 is spaced apart from the third gate structure GS3 in the second direction D2 with the second gate structure GS2 interposed therebetween as illustrated in FIG. 11, the second contact CT2 may be connected in common to the second gate structure GS2 and to the fourth gate structure GS4.

In other embodiments, unlike FIG. 11, the fourth gate structure GS4 may be provided in plurality. In this case, one of the first and second contacts CT1 and CT2 may extend in the second direction D2 so as to be connected in common to the plurality of fourth gate structures GS4 and to one of the first and second gate structures GS1 and GS2.

The first contact CT1, the second contact CT2, and the third contact CT3 may be aligned with each other in the second direction D2 to constitute one row when viewed from a plan view. The first contact CT1, the second contact CT2, and the third contact CT3 may be formed of the same material.

As described with reference to FIG. 4, the first and second widths W1 and W2 of the first and second contacts CT1 and CT2 may be greater than the third width W3 of the third contact W3. According to the present embodiment, the second width W2 may be greater than the first width W1. The fourth width W4 of the first contact CT1, the fifth width W5 of the second contact CT2, and the sixth width W6 of the third contact CT3 may be equal to each other.

Top surfaces of the source/drain contacts 140 and top surfaces of the gate contacts CT may be disposed at the same level from the substrate 100. In other words, the top surfaces of the first, second, and third contacts CT1, CT2, and CT3 may be disposed at the same level from the substrate 100 and may be disposed at the same level as the top surfaces of the source/drain contacts 140.

A second interlayer insulating layer 130 covering the source/drain contacts 140 and the gate contacts CT may be provided on the first interlayer insulating layer 110. The top surfaces of the source/drain contacts 140 and the gate contacts CT may be disposed at the substantially same level as a top surface of the second interlayer insulating layer 130.

A third interlayer insulating layer 150 may be provided on the second interlayer insulating layer 130, and via-contacts VC may be provided in the third interlayer insulating layer 150. The gate contacts CT may be connected to the via-contacts VC corresponding thereto, respectively. A fourth interlayer insulating layer 160 may be provided on the third interlayer insulating layer 150, and conductive lines 170 may be provided in the fourth interlayer insulating layer 160. The gate contacts CT may be electrically connected to the conductive lines 170 through the corresponding via-contacts VC. Even though not shown in the drawings, the source/drain contacts 140 may be electrically connected to corresponding conductive lines (not shown) through corresponding via-contacts (not shown).

According to embodiments of the inventive concepts, the gate contacts which are respectively connected to the gate structures extending in the first direction and continuously arranged in the second direction may be aligned with each other in the second direction to constitute one row. The gate contacts may include a pair of gate contacts respectively disposed at one end and another end of the row, and other gate contacts disposed between the pair of gate contacts. The width, in the second direction, of each of the pair of gate contacts may be greater than the width, in the second direction, of each of the other gate contacts. Since a dummy gate structure is not disposed between the gate structures, the cell area increase in the second direction may be minimized to improve the integration density of the semiconductor device. In addition, since the gate contacts are aligned with each other in the second direction to constitute the one row, the area reduction of the active regions adjacent to each other in the first direction may be minimized. Thus, performance deterioration of the semiconductor device may be minimized. Furthermore, since the width of each of the pair of gate contacts is greater than the width of each of the other gate contacts, positions of via-contacts may be relatively free on the gate contacts.

In the above embodiments, the active patterns AP may have a fin-shape. However, the inventive concepts are not limited thereto. The shape of the active pattern may be variously modified.

Figure 13:
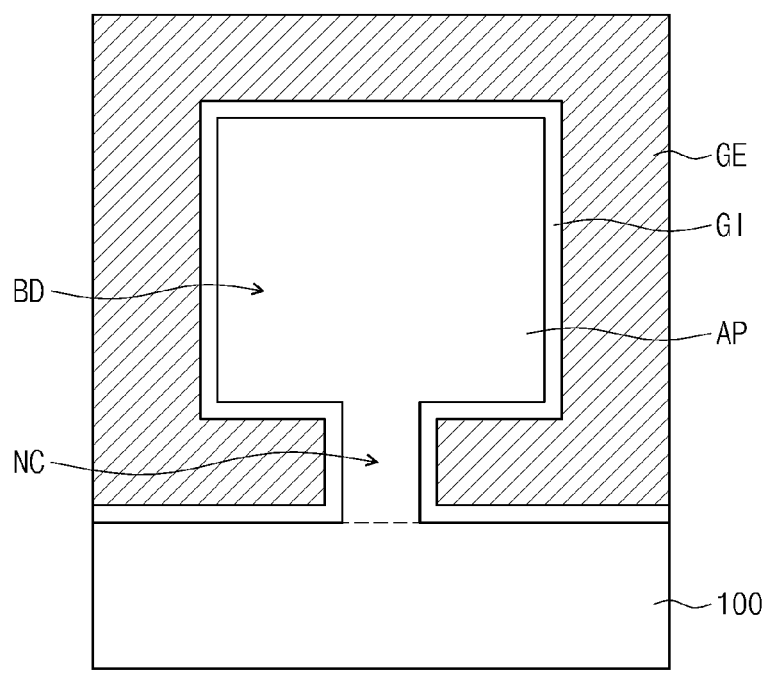
FIG. 13 is a conceptual diagram illustrating an active pattern of a semiconductor device according to still other embodiments of the inventive concepts.

FIG. 13 is a conceptual diagram illustrating an active pattern of a semiconductor device according to still other embodiments of the inventive concepts. In the present embodiment, a cross section of an active pattern AP may have an omega shape that includes a neck portion NC adjacent to a substrate 100 and a body portion BD. A width of the body portion BD may be wider than that of the neck portion NC. A gate insulating pattern GI and a gate electrode GE may be sequentially provided on the active pattern AP. A portion of the gate electrode GE may extend under the body portion BD.

Figure 14:
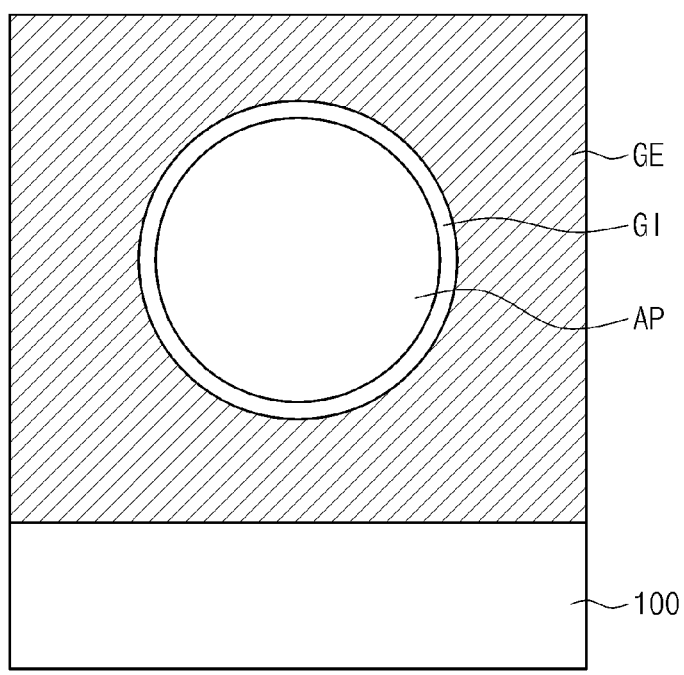
FIG. 14 is a conceptual diagram illustrating an active pattern of a semiconductor device according to yet other embodiments of the inventive concepts.

FIG. 14 is a conceptual diagram illustrating an active pattern of a semiconductor device according to yet other embodiments of the inventive concepts. In the present embodiment, an active pattern AP of a semiconductor device may have a nano-wire shape that is spaced apart from a substrate 100. A gate insulating pattern GI and a gate electrode GE may be sequentially provided on the active pattern AP. The gate electrode GE may extend into a region between the active pattern AP and the substrate 100.

Figure 15:
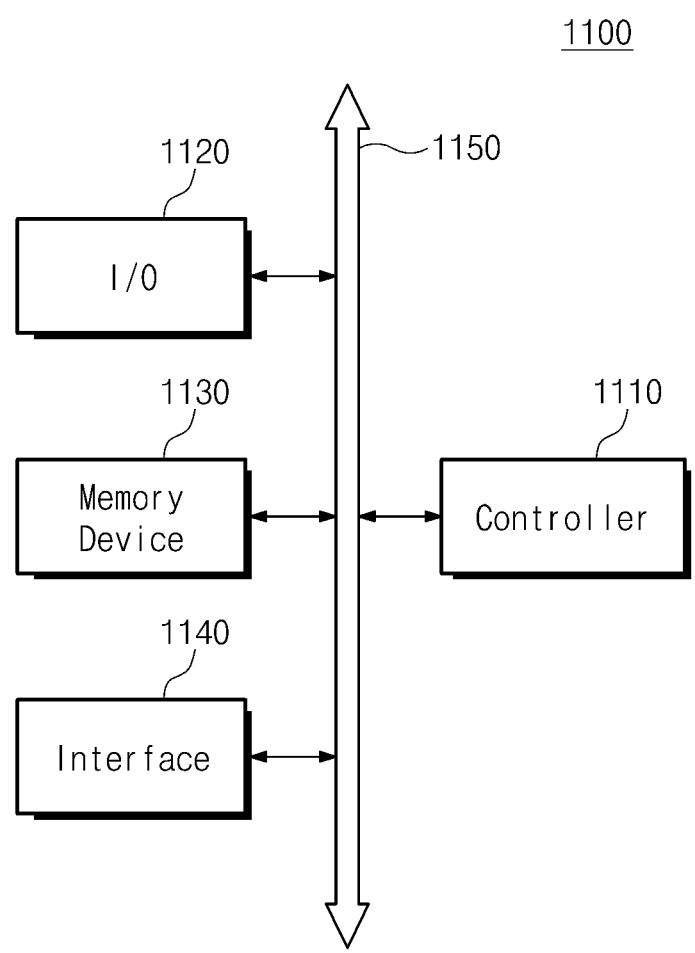
FIG. 15 is a schematic block diagram illustrating an electronic system including a semiconductor device according to embodiments of the inventive concepts.

FIG. 15 is a schematic block diagram illustrating an electronic system including a semiconductor device according to embodiments of the inventive concepts.

As used herein, a semiconductor device may refer to any of the various devices such as shown in FIGS. 1-14, and may also refer, for example, to one or more transistors, logic devices, or cell arrays, or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, a hard drive including additional components, or a mobile phone, laptop, tablet, desktop, camera, or other consumer electronic device, etc.

Referring to FIG. 15, an electronic system 1100 according to an embodiment of the inventive concepts may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical data are transmitted.

The controller 1110 may include at least one of a microprocessor, a digital signal processor, a microcontroller, or other logic devices having a similar function to any one thereof. The I/O unit 1120 may include a keypad, a keyboard and/or a display device. The memory device 1130 may store data and/or commands. The interface unit 1140 may transmit electrical data to a communication network or may receive the electrical data from the communication network. The interface unit 1140 may operate by wireless or by a cable. For example, the interface unit 1140 may include an antenna or a wireless/cable transceiver. Although not shown in the drawings, the electronic system 1100 may further include a fast dynamic random access memory (fast DRAM) device and/or a fast static random access memory (fast SRAM) device which acts as a cache memory for improving an operation of the controller 1110. At least one of the semiconductor devices according to the aforementioned embodiments of the inventive concepts may be provided to the memory device 1130, the controller 1110, and/or the I/O unit 1120.

The electronic system 1100 may be applied to an electronic device such as a personal digital assistant (PDA), a portable computer, a web tablet, a wireless phone, a mobile phone, a digital music player, a memory card, or other electronic products receiving and/or transmitting information data by wireless.

According to embodiments of the inventive concepts, the gate contacts which are respectively connected to the gate structures extending in the first direction and continuously arranged in the second direction may be aligned with each other in the second direction to constitute one row. The gate contacts may include a pair of gate contacts respectively disposed at one end and another end of the row, and other gate contacts disposed between the pair of gate contacts. The width, in the second direction, of each of the pair of gate contacts may be greater than the width, in the second direction, of each of the other gate contacts. Since a dummy gate structure is not disposed between the gate structures, the cell area increase in the second direction may be minimized to improve the integration density of the semiconductor device. In addition, since the gate contacts are aligned with each other in the second direction to constitute the one row, the area reduction of the active regions adjacent to each other in the first direction may be minimized. Thus, the performance deterioration of the semiconductor device may be minimized. Furthermore, since the width of each of the pair of gate contacts may be greater than the width of each of the other gate contacts, positions of via-contacts may be relatively free on the gate contacts.

While various aspects of the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the invention is to be determined by the broadest permissible interpretation of the following claims and their equivalents, and shall not be restricted or limited by the foregoing description.

What is claimed is:

1. A semiconductor device comprising:
    a first gate structure and a second gate structure extending in a first direction and spaced apart from each other in a second direction intersecting the first direction on a substrate;
    a third gate structure extending in the first direction and disposed between the first and second gate structures on the substrate;
    a first contact connected to the first gate structure in a manner such that the first contact vertically overlaps the first gate structure and a bottom surface of the first contact is in contact with an upper surface of the first gate structure, and having a first width in the second direction;
    a second contact connected to the second gate structure in a manner such that the second contact vertically overlaps the second gate structure and a bottom surface of the second contact is in contact with an upper surface of the second gate structure, and having a second width in the second direction; and
    a third contact connected to the third gate structure in a manner such that the third contact vertically overlaps the third gate structure and a bottom surface of the third contact is in contact with an upper surface of the third gate structure, and having a third width in the second direction,
    wherein the first contact, the second contact and the third contact are aligned with each other in the second direction, and form a row,
    the first width is greater than the third width, and
    the second width is greater than the third width.

2. The semiconductor device of claim 1, further comprising a dummy gate structure disposed in a first region of the substrate and extending in the first direction, wherein the first, second, and third gate structures are disposed in a second region of the substrate and continuously arranged in the second direction, and
    the dummy gate structure is disposed at a side of at least one of the first and second gate structures on the substrate,
    but not disposed between the first and third gate structures nor between the second and third gate structures.

3. The semiconductor device of claim 1, wherein the first contact has a fourth width in the first direction,
    the second contact has a fifth width in the first direction,
    the third contact has a sixth width in the first direction, and
    the fourth width, the fifth width, and the sixth width are equal to each other.

4. The semiconductor device of claim 1, wherein the third gate structure includes a plurality of third gate structures,
    the third contact includes a plurality of third contacts, and
    each of the plurality of third contacts are connected to a corresponding one of the plurality of third gate structures and a bottom surface of each of the plurality of third contacts is in contact with an upper surface of the corresponding one of the plurality of third gate structures.

5. The semiconductor device of claim 4, further comprising a dummy gate structure disposed in a first region of the substrate and extending in the first direction, wherein the first, second, and third gate structures are disposed in a second region of the substrate and continuously arranged in the second direction, and
    the dummy gate structure is disposed at a side of at least one of the first and second gate structures on the substrate, but not disposed between the first and third gate structures nor between the second and third gate structures.

6. The semiconductor device of claim 1, further comprising a plurality of via-contacts, each of the plurality of via-contacts being connected to a corresponding one among the first contact, the second contact and the third contact,
    wherein the plurality of via-contacts are configured to apply a voltage to the first gate structure, the second gate structure, and the third gate structure through the first contact, the second contact, and the third contact.

7. The semiconductor device of claim 1, wherein the first width is equal to the second width.

8. The semiconductor device of claim 1, wherein the first width is different from the second width.

9. The semiconductor device of claim 1, further comprising a fourth gate structure spaced apart from the third gate structure in the second direction, one of the first and second gate structures being interposed between the third gate structure and the fourth gate structure, the fourth gate structure extending in the first direction on the substrate,
    wherein one of the first and second contacts extends in the second direction, and is configured to be connected in common to the fourth gate structure and to one of the first and second gate structures.

10. The semiconductor device of claim 1, wherein top surfaces of the first, second, and third contacts are disposed at the same level from the substrate.

11. The semiconductor device of claim 1, wherein the first, second, and third contacts are formed of the same material.

12. The semiconductor device of claim 1, further comprising a device isolation layer formed in the substrate and defining active patterns, wherein the active patterns extend in the second direction and are spaced apart from each other in the first direction, each of the active patterns includes an upper portion exposed by the device isolation layer, and the first, second, and third gate structures are disposed on the substrate and intersect the active patterns.

13. The semiconductor device of claim 12, further comprising source/drain regions disposed in the active patterns at both sides of each of the first to third gate structures; and source/drain contacts connected to the source/drain regions, wherein top surfaces of the source/drain contacts are disposed at the same level with top surfaces of the first, second and third contacts.

14. The semiconductor device of claim 13, wherein the source/drain contacts are formed of the same material as the first, second and third contacts.

15. A semiconductor device comprising:

a first gate structure and a second gate structure extending in a first direction and spaced apart from each other in a second direction intersecting the first direction;

a third gate structure extending in the first direction and disposed between the first and second gate structures;

active patterns disposed under the first to third gate structures and intersecting the first to third gate structures;

source/drain regions disposed in the active patterns at both sides of each of the first to third gate structures;

source/drain contacts connected to the source/drain regions;

a first contact connected to the first gate structure in a manner such that the first contact vertically overlaps the first gate structure and having a first width above an upper surface of the first gate structure in the second direction;

a second contact connected to the second gate structure in a manner such that the second contact vertically overlaps the second gate structure and having a second width above an upper surface of the second gate structure in the second direction; and a third contact connected to the third gate structure in a manner such that the third contact vertically overlaps the third gate structure and having a third width above an upper surface of the third gate structure in the second direction, wherein top surfaces of the source/drain contacts are disposed at the same level with top surfaces of the first, second and third contacts, the first contact, the second contact and the third contact are aligned with each other in the second direction, and form a row, the first width above the upper surface of the first gate structure is greater than the third width above the upper surface of the third gate structure, and the second width above the upper surface of the second gate structure is greater than the third width above the upper surface of the third gate structure.

16. The semiconductor device of claim 15, wherein the source/drain contacts and the first to third contacts are formed of the same material.

17. The semiconductor device of claim 15, wherein the first contact has a fourth width in the first direction, the second contact has a fifth width in the first direction, the third contact has a sixth width in the first direction, and the fourth width, the fifth width, and the sixth width are equal to each other.

18. The semiconductor device of claim 15, further comprising a dummy gate structure disposed in a first region and extending in the first direction, wherein the first, second, and third gate structures are disposed in a second region and continuously arranged in the second direction and the dummy gate structure is disposed at a side of at least one of the first and second gate structures, but not disposed between the first and third gate structures nor between the second and third gate structures.

19. The semiconductor device comprising:

a substrate;

a first gate structure disposed on the substrate and extending in a first direction;

a second gate structure disposed on the substrate and extending in the first direction, the second gate structure being spaced apart from the first gate structure;

a third gate structure disposed on the substrate and extending in the first direction, the third gate structure being disposed between the first and second gate structures;

a first contact connected to the first gate structure in a manner such that the first contact vertically overlaps the first gate structure;

a second contact connected to the second gate structure in a manner such that the second gate structure vertically overlaps the second gate structure; and a third contact connected to the third gate structure in a manner such that the third gate structure vertically overlaps the third gate structure; and a dummy gate structure disposed in a first region of the substrate and extending in the first direction wherein the first, second, and third gate structures are disposed in a second region of the substrate and continuously arranged and aligned with each other in a second direction that is different from the first direction, and the first contact, the second contact and the third contact form a row, and the dummy gate structure is disposed at a side of at least one of the first and second gate structures, but not disposed between the first and third gate structures nor between the second and third gate structures.

20. The semiconductor device of claim 19, further comprising a plurality of via-contacts, each of the plurality of via-contacts being connected to a corresponding one among the first contact, the second contact, and the third contact, wherein the plurality of via-contacts are configured to apply a voltage to the first gate structure, the second gate structure, and the third gate structure through the first contact, the second contact, and the third contact.

* * * * *